US006471460B1

(12) United States Patent
Pedersen et al.

(10) Patent No.: US 6,471,460 B1
(45) Date of Patent: Oct. 29, 2002

(54) APPARATUS FOR PROCESSING A MICROELECTRONIC WORKPIECE INCLUDING A WORKPIECE CASSETTE INVENTORY ASSEMBLY

(75) Inventors: John M. Pedersen; Kyle M. Hanson, both of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 55 days.

(21) Appl. No.: 09/611,860

(22) Filed: Jul. 7, 2000

Related U.S. Application Data

(63) Continuation-in-part of application No. 08/991,062, filed on Dec. 15, 1997, now Pat. No. 6,091,498, which is a continuation-in-part of application No. 08/680,056, filed on Jul. 15, 1996, now abandoned.

(51) Int. Cl.[7] .............................................. B65G 49/07
(52) U.S. Cl. ................. 414/222.09; 414/940; 414/749.5
(58) Field of Search ........................ 414/222.04, 222.07, 414/222.09, 749.5, 940

(56) References Cited

U.S. PATENT DOCUMENTS 5,464,313 A * 11/1995 Ohsawa ...................... 414/940
5,853,486 A * 12/1998 Ono et al. ................... 414/940
5,947,675 A * 9/1999 Matsushima ................. 414/940
6,091,498 A    7/2000 Hanson et al.
6,102,647 A * 8/2000 Yap ............................ 414/940
6,169,935 B1 * 1/2001 Iwasaki et al. .............. 414/940
6,279,724 B1 * 8/2001 Davis .......................... 414/940
6,283,692 B1 * 9/2001 Perlov et al. ................ 414/940

FOREIGN PATENT DOCUMENTS

JP      4-298059    * 10/1992    ................. 414/940
JP      5-47896     *  2/1993    ................. 414/940

* cited by examiner

Primary Examiner—James W. Keenan
(74) Attorney, Agent, or Firm—Perkins Coie LLP

(57) ABSTRACT

An apparatus is set forth for providing access to individual workpiece positions in a microelectronic workpiece cassette. The assembly comprises a workpiece cassette inventory assembly having a plurality of cassette inventory cassette supports, which are selectively aligned with the staging cassette supports of a workpiece staging assembly. This allows a plurality of cassettes to be separately indexed, thereby enabling the workpiece staging assembly to access multiple cassettes and process a larger number of microelectronic workpieces between loading/unloading cycles that require user activity.

22 Claims, 15 Drawing Sheets

APPARATUS FOR PROCESSING A MICROELECTRONIC WORKPIECE INCLUDING A WORKPIECE CASSETTE INVENTORY ASSEMBLY

CROSS-REFERENCE TO RELATED APPLICATIONS

This application is a continuation-in-part of U.S. application Ser. No. 08/991,062, filed Dec. 15, 1997, now U.S. Pat. No. 6,091,498, which is a continuation-in-part of U.S. application Ser. No. 08/680,056, filed Jul. 15, 1996, now abandoned.

STATEMENT REGARDING FEDERALLY SPONSORED RESEARCH OR DEVELOPMENT

Not Applicable

BACKGROUND OF THE INVENTION

The present invention is directed to an apparatus for processing a microelectronic workpiece. More particularly, the present invention is directed to an improved input/output station that receives multiple microelectronic workpiece cassettes and selectively aligns the cassettes with and transfers them to a workpiece cassette staging assembly. For purposes of the present application, a microelectronic workpiece is defined to include a workpiece formed from a substrate upon which microelectronic circuits or components, data storage elements or layers, and/or micromechanical elements are formed.

Multiple processes must be executed upon a microelectronic workpiece to manufacture desired microelectronic circuits, devices, or components. These processes are generally executed in processing tools that are specifically designed to implement one or more of the requisite processes. In order to automate the processing and minimize operator handling, tool architectures have been developed that incorporate multiple processing stations and automated transfer of the microelectronic workpieces from one processing station to the next. For example, tools of this type are available from Semitool, Inc., of Kalispell, Mont., under the brand names Equinox®, LT-210®, LT-210C and Millennium.

In such tools, the workpieces are processed individually at the various processing stations. Furthermore, multiple workpieces are concurrently processed at different processing stations. Thus, one workpiece may be processed in one of the processing stations while another workpiece is concurrently processed in another one of the processing stations. In this way, a pipeline processing approach can be developed, which enhances production throughput. Additionally, processing steps that take longer to perform may have multiple processing stations devoted to performing that particular processing step, thereby enhancing production throughput.

In many instances, multiple microelectronic workpieces are concurrently supplied to the tool in a cassette. Each cassette generally includes a plurality of individual workpiece positions or slots, where each slot is adapted to hold an individual workpiece. Typically, a first cassette containing a plurality of workpieces is loaded into the tool, and a second empty cassette is loaded into the tool for receiving the same workpieces after they have been processed. Alternatively, the processed workpieces may be returned to their original cassette, thereby enabling concurrent loading of two cassettes containing unprocessed workpieces.

When processing of the workpieces contained within a given cassette is complete, an operator removes the one or more cassettes containing the processed workpieces and loads new cassettes that contain the next set of workpieces that are to be processed. Consequently, periodically an operator must remove processed workpieces from the tool and supply the next set of workpieces that are to be processed. As workpiece processing tools achieve greater workpiece throughput, the time it takes for the tool to process the workpieces contained within a cassette decreases. As a result, operators must more frequently load and unload the workpiece cassettes, requiring temporary interruption of any workpiece processing taking place at that time. Furthermore, during this loading and unloading time, the operator is prevented from attending to other duties requiring a higher level of skill. Consequently, to the extent that the time required for operator activity can be reduced or minimized overall microelectronic fabrication efficiencies can be enhanced. Moreover, because operators can be a source of particle contamination, less frequent operator interface with the tool can reduce the potential for particle contamination of the workpieces.

The present inventors have recognized that overall microelectronic fabrication efficiencies can be increased by reducing the frequency of loading/unloading cycles for a given number of workpieces. Further, they have recognized that one manner of reducing the frequency of loading/unloading cycles is to allow loading and/or unloading of a greater number of workpieces to and/or from the tool during a given cycle. This would enable the tool to process workpieces for a longer period of time before the next load/unload cycle requires operator activity. Still further, the present inventors have recognized the advantages of developing an apparatus and/or method that allows a greater number of workpieces to be loaded and/or unloaded from a tool while concurrently requiring minimal modifications and/or adjustments to an existing set of tools that are already installed and operational at a microfabrication facility and which occupies a minimum amount of manufacturing floor area.

To this end, the present inventors have developed a workpiece cassette inventory assembly that receives multiple workpiece cassettes and selectively aligns the cassettes for transfer to and from a staging assembly that allows access to the individual workpiece slots of the cassettes such as, for example, a lift/tilt assembly or the like.

BRIEF SUMMARY OF THE INVENTION

An apparatus for providing access to individual workpiece positions in a microelectronic workpiece cassette is set forth. The assembly comprises a workpiece cassette inventory assembly including a plurality of inventory cassette supports for receiving a plurality of cassettes. The plurality of cassettes can be selectively indexed to provide one or more of the plurality of cassettes to a workpiece cassette staging assembly by adjusting the positional alignment of the plurality of cassettes. The workpiece cassette staging assembly includes one or more staging cassette supports for receiving the one or more indexed cassettes from the workpiece cassette inventory assembly and repositions the one or more indexed cassettes, so as to provide access to the one or more microelectronic workpieces contained within the indexed cassettes, wherein the inventory cassette supports of the indexed cassettes are positionally aligned with the corresponding staging cassette support. This allows a tool incorporating the assembly to process a larger number of microelectronic workpieces between user intervening loading and unloading cycles.

In accordance with one embodiment of the present invention, the apparatus is incorporated in an input/output section of a microelectronic workpiece processing tool. The input/output section receives the one or more cassettes by a workpiece cassette inventory assembly. The workpiece cassette inventory assembly can then selectively adjust the alignment of the one or more cassettes with respect to a corresponding workpiece staging assembly for transfer therebetween. The workpiece staging assembly receives the one or more cassettes from the workpiece cassette inventory assembly and positions them to allow access to individual workpiece positions of the one or more cassettes, including access to any microelectronic workpieces disposed at the workpiece positions.

DETAILED DESCRIPTION OF THE INVENTION

Figure 1:
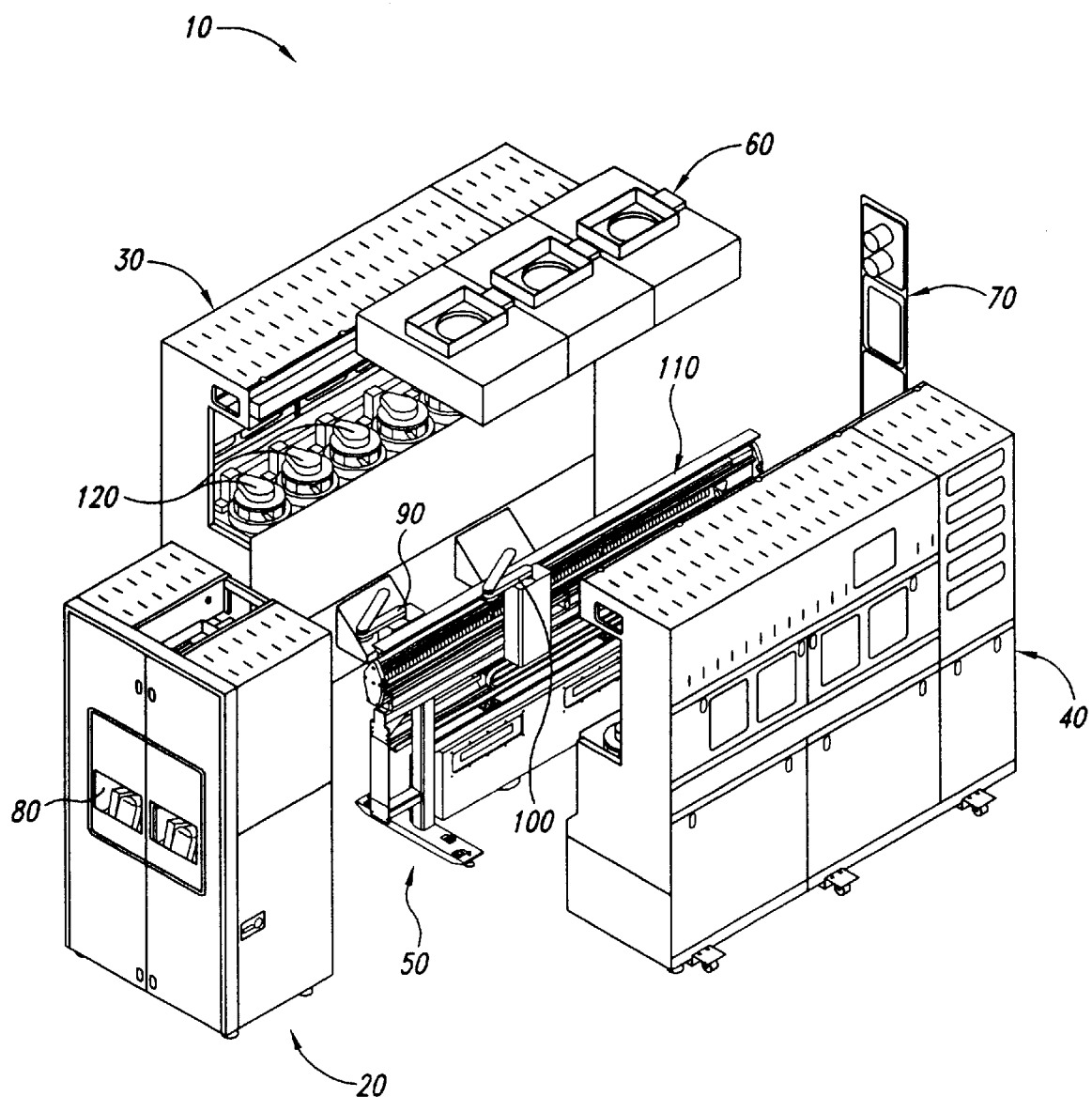
FIG. 1 is an exploded isometric view of an integrated microelectronic workpiece processing tool.

FIG. 1 illustrates an integrated microelectronic workpiece processing tool 10 that is suitable for incorporation of the microelectronic workpiece cassette input/output system described in detail hereinafter. Although modularity is not necessary to the overall tool function, the tool 10 is shown as having been separated into individual modular components. The exemplary integrated microelectronic workpiece processing tool 10 of FIG. 1 comprises a microelectronic workpiece input/output section 20, a processing section including one or more processing subsections (two subsections 30 and 40 being illustrated), a microelectronic workpiece transfer apparatus 50, a filter assembly 60, and an end panel 70.

The microelectronic workpiece input/output section 20 includes an opening 80 through which one or more workpiece cassettes can be received or removed. Generally stated, cassettes that are received at the input/output section 20 contain microelectronic workpieces that are to be processed within the tool 10, while cassettes that are removed from the input/output section 20 contain workpieces that have been processed within the tool 10.

Within input/output section 20, the cassettes are inventoried (i.e. stored) and staged (i.e. positioned or located) so that individual workpieces can be removed from the cassettes by the transfer apparatus 50. In the illustrated tool, workpiece transfer apparatus 50 includes one or more workpiece transport units (two units 90 and 100 being illustrated). The workpiece transport units 90 and 100 transport individual microelectronic workpieces along the conveyor 110 and between individual processing stations 120. The various sections of the integrated microelectronic workpiece processing tool 10 may define an enclosed space that is generally separate from the external environment. To this end, the filter assembly 60 enables purging of airborne contaminants initially present or produced during processing of the workpieces to thereby generate and/or maintain a relatively clean processing environment within the enclosed space. While at least one embodiment of the filter assembly 60 uses a ULPA (Ultra-low penetration air) type filter, other types of filters can also be used. One example of an alternative filter type is a HEPA (High efficiency particulate air) type filter.

After the workpieces are processed, the transfer apparatus 50 places the workpieces into a cassette, and the cassette containing the processed workpieces are removed from the integrated microelectronic workpiece processing tool 10 via the opening 80 in the input/output section 20.

Figure 2:
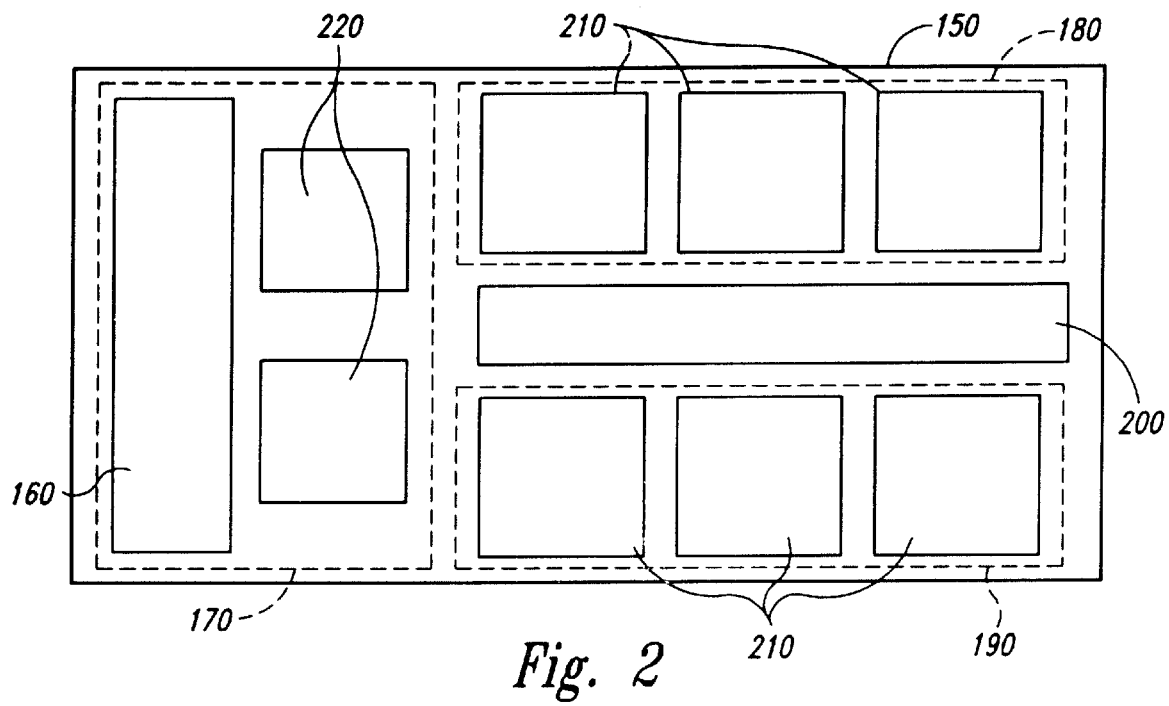
FIG. 2 is a block diagram of an integrated microelectronic workpiece processing tool including a workpiece cassette inventory assembly in accordance with one embodiment of the present invention.

As shown in FIG. 2, the input/output section 20 includes a workpiece cassette inventory assembly 160 where cassettes are accumulated so as to provide a supply of workpieces for the tool 10. The input/output section 20 also includes a workpiece cassette staging assembly 170 that interfaces with a workpiece transfer assembly 200 so that cassettes from the tool's inventory are presented for transfer of individual workpieces between the input/output section and the transfer assembly 200. Workpiece transfer assembly 200 transfers individual workpieces between the staging assembly 170 and one or more processing stations 210 of one or more processing sections 180, 190. Workpiece cassettes are inserted into and removed from the inventory assembly 160 through the load port opening 80 (FIG. 1). Cassettes are transferred between the inventory assembly 160 and the staging assembly 170. Workpieces are transferred between the staging assembly 220 and the transfer assembly 200.

The input/output assembly 20 illustrated in FIGS. 3–9 comprises a four-station inventory assembly 160 and a two-station staging assembly 170. The inventory assembly 160 is designed to provide four stations that will each carry a workpiece cassette. The inventory assembly 160 is designed to shuttle the four stations to extended and retracted positions. When in the extended positions, the four stations (160a, 160b, 160c, 160d) are separated from one another a sufficient distance to enable an operator, standing at the load port opening 80, to manually insert and remove a cassette from the inventory assembly 160 without interfering with an adjacent cassette. When in the retracted positions, the four stations are brought close together to reduce the free space between adjacent cassettes for reasons that will be explained hereinafter. The two-station staging assembly 170 comprises two staging units 220a, 220b positioned next to the inventory assembly 160 at locations that permit the staging units to be accessed by a transport unit 90 of the workpiece transfer apparatus 200 so that cassettes can be transferred to and from the inventory assembly 160 and so that individual workpieces can be transferred between each staging unit and the transfer apparatus 200. As will be explained hereinafter, each staging unit 220a, 220b is situated to interface with two of the four inventory assembly stations; namely unit 220a handles stations 160a and 160b, and unit 220b handles stations 160c and 160d. Where, however, a particular processing tool has need of only one staging unit, the shuttle features of the inventory assembly 160 may be adjusted accordingly.

Due to the configuration of some processing tools, it may be that the elevation at which workpieces are processed in the tool is higher than an ergonomically-desirable elevation for manually loading or unloading cassettes from the tool's input/output section. The input/output assembly 20 is designed to accommodate this situation by positioning the inventory assembly stations 160a, 160b, 160c and 160d at an ergonornically-acceptable elevation, and by providing the two staging units 220a and 220b with the capability to interface with the inventory assembly stations at a lower elevation and to elevate a cassette to a higher elevation so as to interface with the transfer apparatus 200 at a higher elevation. This capability is reflected in FIGS. 4–9 where the staging units 220a and 220b are illustrated supporting cassettes C1 and C2 (shown in phantom) at an elevation higher than the cassettes C3, C4, C5 and C6 at the four inventory assembly stations. Where ergonomic considerations do not dictate that the input/output section accommodate two cassette elevational positions, the staging units may not include the capability to elevate cassettes from one elevation to another.

Figure 4:
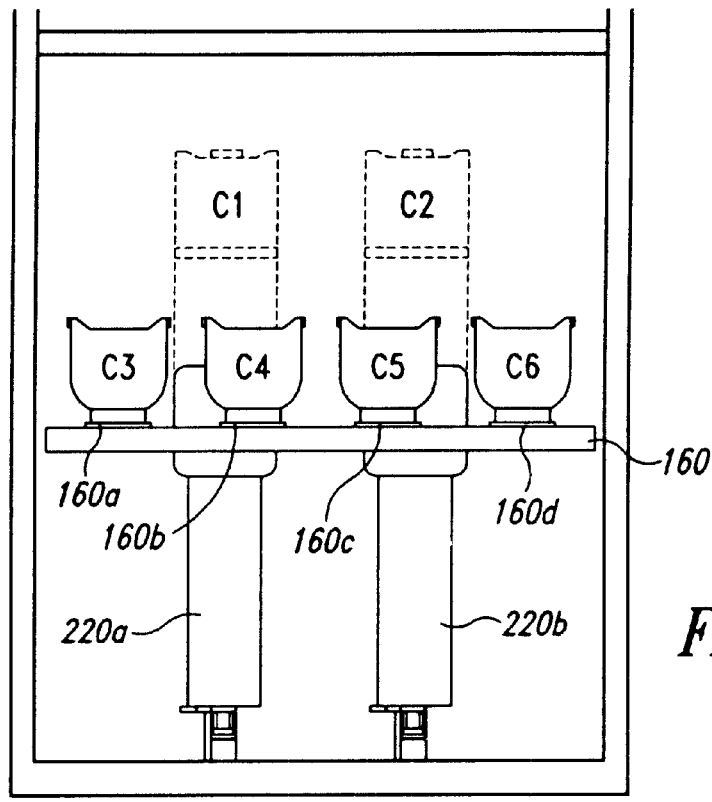
FIGS. 4–9 are elevation views showing various cassette horizontal spacing configurations and their corresponding alignment with the staging cassette supports of the workpiece cassette staging assembly.
Figure 5:
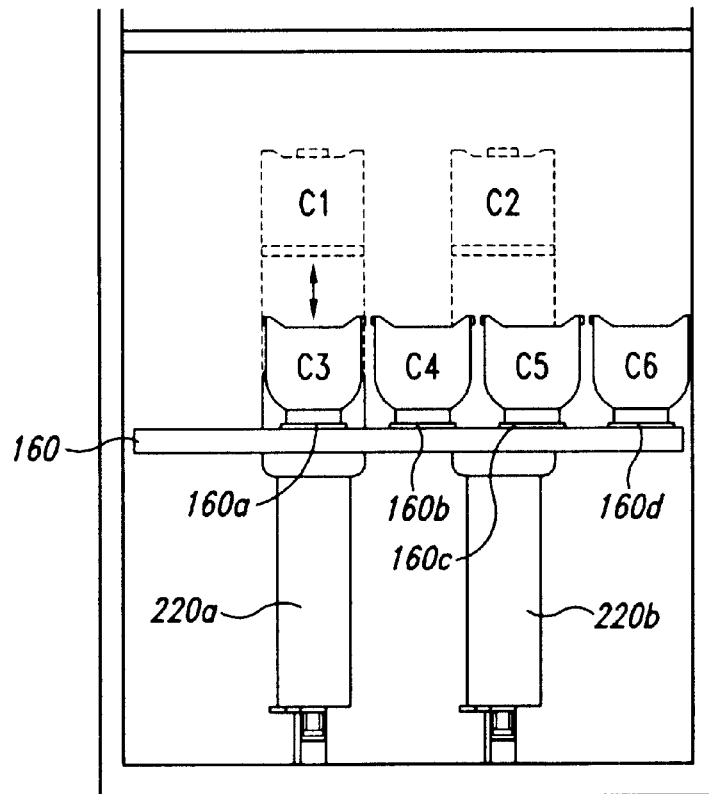
Figure 6:
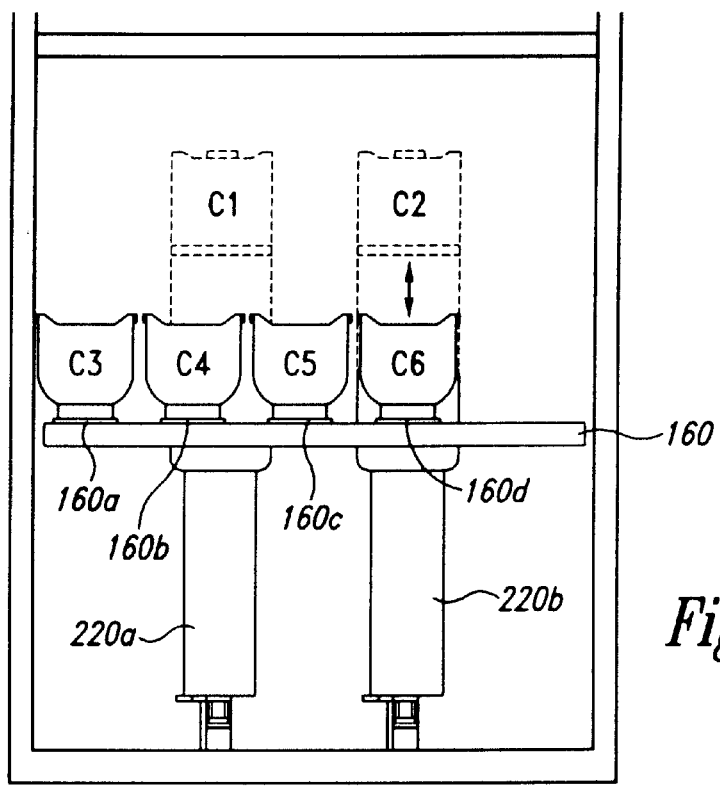
Figure 7:
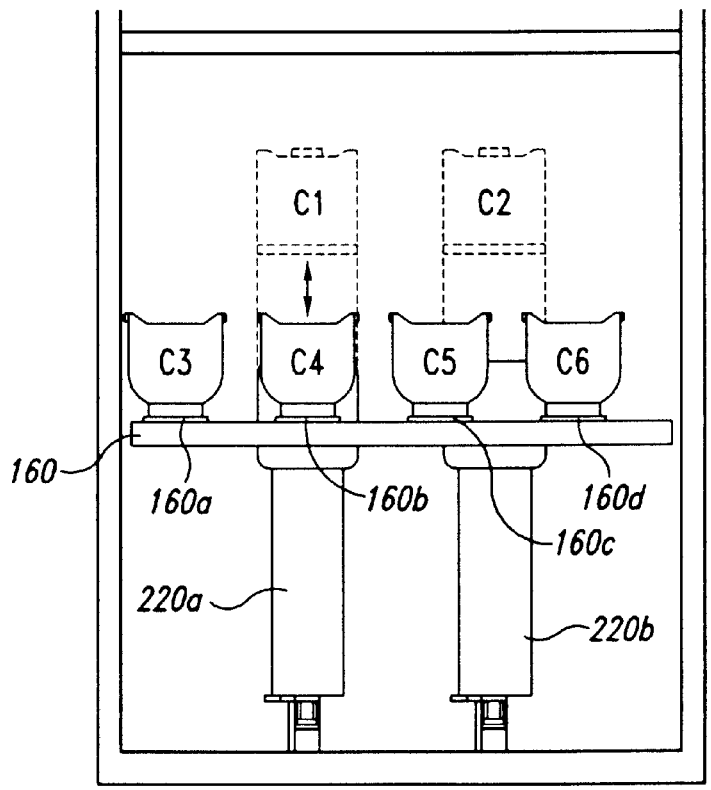
Figure 8:
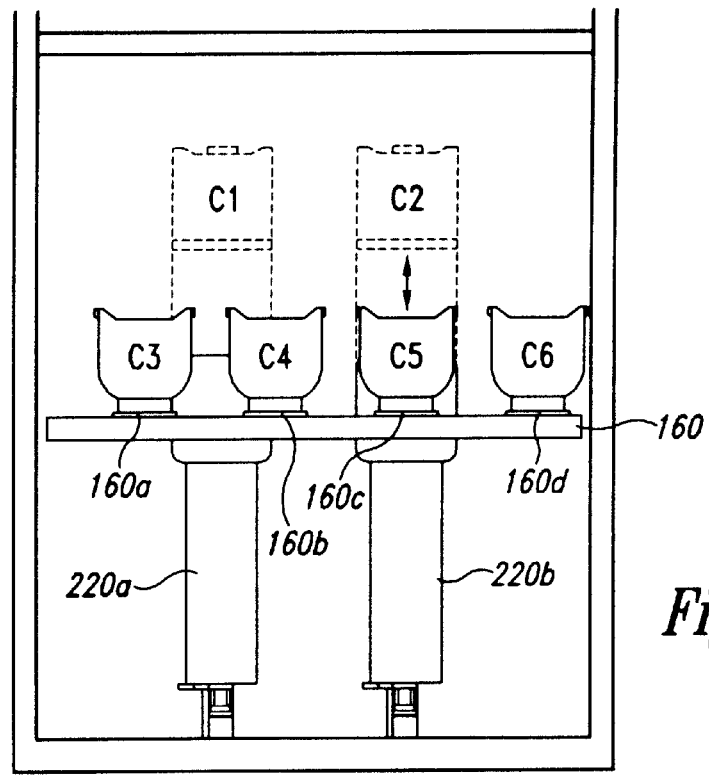

The inventory assembly shuttle feature, whereby the spacing between the cassette stations may be expanded or retracted relative to one another, permits the storage of multiple cassettes in a relative small space. In FIG. 4, four cassettes C3–6 are each carried by the inventory assembly, one at each station, where the stations are extended so that there is sufficient spacing between the cassettes to enable an operator to manually grasp and insert or remove each cassette without interference from an adjacent cassette. As is apparent from FIG. 4, however, in this extended situation, none of the cassettes are aligned with either of the staging units 220a or 220b. However, by retracting the inventory assembly to bring the stations together and shuttling the stations toward the right (as viewed from the perspective of an operator standing at the load port opening 80), station 160a can be brought into alignment with staging unit 220a, as illustrated in FIG. 5. Once in position as illustrated in FIG. 5, cassette C3 may be transferred to staging unit 220a and assume the position of C1 or be returned from staging unit 220a to station 160a. If the retracted inventory assembly stations are shuttled to the left, instead of the right, illustrated in FIG. 6, cassette C6 at station 160d may be aligned with the other staging unit 220b for transfer and may assume the position of C2. Without retracting the inventory assembly stations, but rather, only shuttling the extended stations to the left, cassette C4 may be aligned with staging unit 220a, illustrated in FIG. 7, for transfer and may assume the position of C1. Also without retracting the inventory assembly stations, but rather only shuttling the extended stations to the right, cassette C5 may be aligned with staging unit 220b, illustrated in FIG. 8, for transfer and may assume the position of C2.

Figure 9:
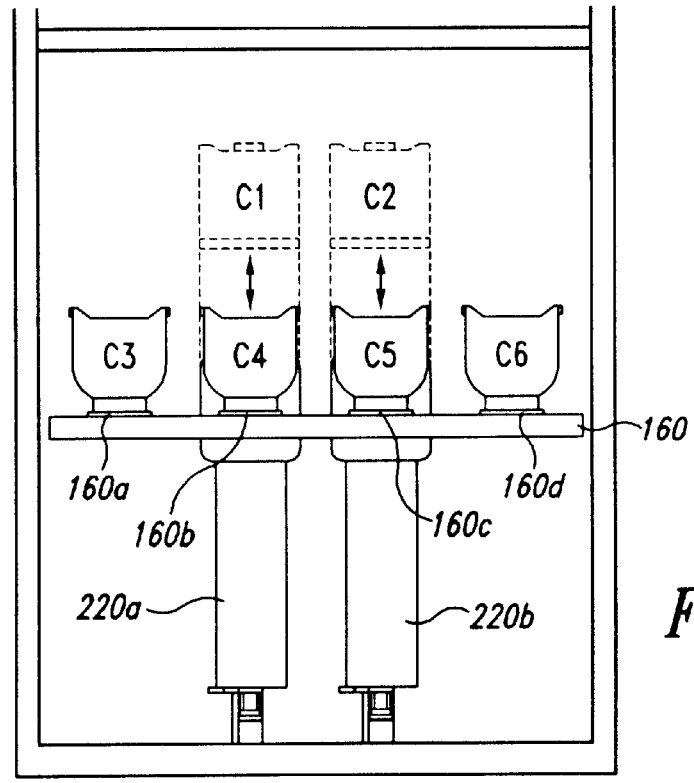

In an alternative embodiment illustrated in FIG. 9, the staging units 220 are located a little closer together so as to correspond to the center two cassette stations 160b and 160c when the cassettes stations are extended during initial loading. This alternative configuration is similarly illustrated in the plan view of FIG. 3. In this embodiment staging unit 220a can access cassette C4 and staging unit 220b can access cassette C5 without a corresponding linear shift of the cassettes. In this embodiment, in order to access the cassettes C3 and C6, similar to FIGS. 5 and 6, the cassettes are both retracted and shifted.

Therefore, by extending or retracting the inventory assembly stations and by shuttling the stations leftward or rightward (while either extended or retracted) all four stations may be aligned with one or the other of the staging units so that cassettes at the stations may be transferred between one or the other of the staging units. By this arrangement, staging units 220a and 220b have the capability to move cassettes vertically and the inventory assembly has the capability to move the cassettes horizontally, an efficient division of kinematic requirements, while also permitting convenient operator access to the inventory assembly cassette stations for cassette insertion and removal. As illustrated in the figures discussed thus far, each staging unit 220 generally has a single cassette support for holding an individual cassette, and the workpiece cassette inventory assembly 160 has a plurality of cassette supports, one for each station, capable of holding a plurality of cassettes. When a particular cassette is to be accessed by the workpiece transfer apparatus 200, the workpiece cassette inventory assembly 160 selectively aligns the cassette with a corresponding one of the assemblies 220 and transfers the cassette to the staging assembly 220. In this way, the number of cassettes that an operator can load into and/or remove from the integrated microelectronic workpiece processing tool 10 is defined by the number of stations/supports of the workpiece cassette inventory assembly 160, which is generally greater than the number of cassettes that a given staging assembly 220 is capable of handling at a given time.

Once the inventory cassette support 160a, 160b, 160c or 160d is aligned with the corresponding staging assembly 220 the cassette can be transferred between the inventory cassette support of the workpiece cassette inventory assembly 160 and the staging assembly 220. FIGS. 10–13 illustrate at least one sequence, where a cassette carrier 660 is transferred between an inventory cassette support 230 of the workpiece cassette inventory assembly 160 and a staging cassette support 630 of one of the lift/tilt assemblies 225.

Figure 10:
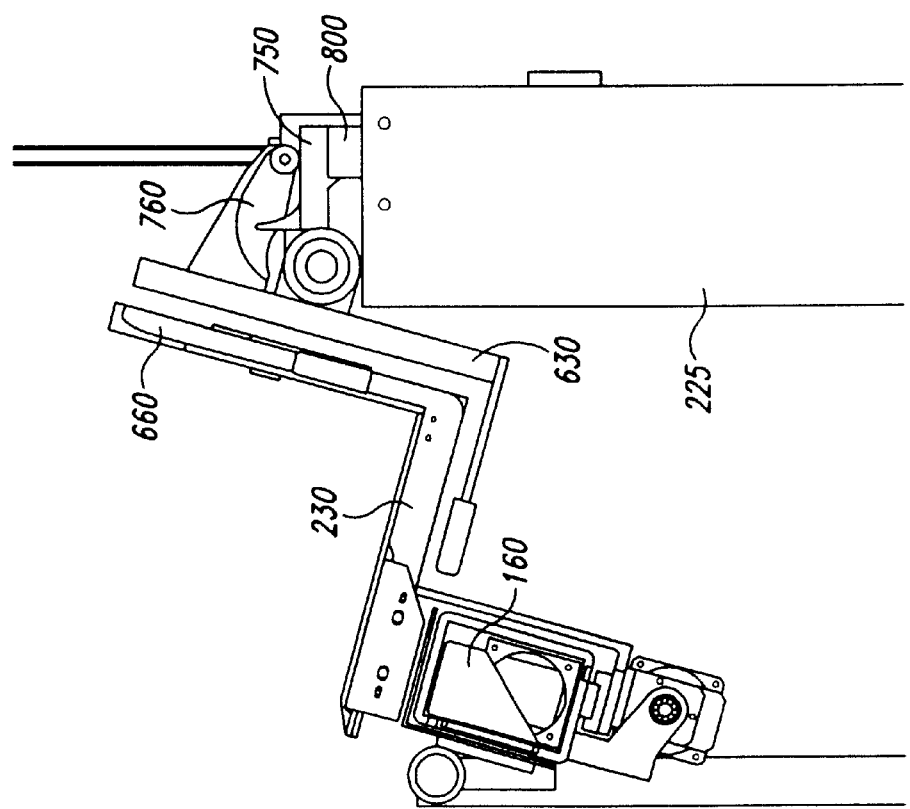

FIG. 10 illustrates a cassette carrier 660 engaged by the inventory cassette support 230 of the workpiece cassette inventory assembly 160, where the staging cassette support 630 of the lift/tilt assembly 225 is below the inventory cassette support 230 of the workpiece cassette inventory assembly 160. The staging cassette support 630 of the lift/tilt assembly 225 is in a substantially workpiece vertical orientation. In this state the workpiece cassette inventory assembly 160 can perform either horizontal motions, namely the cassettes can be shifted to either the right or the left or the cassettes can be expanded or retracted.

Figure 11:
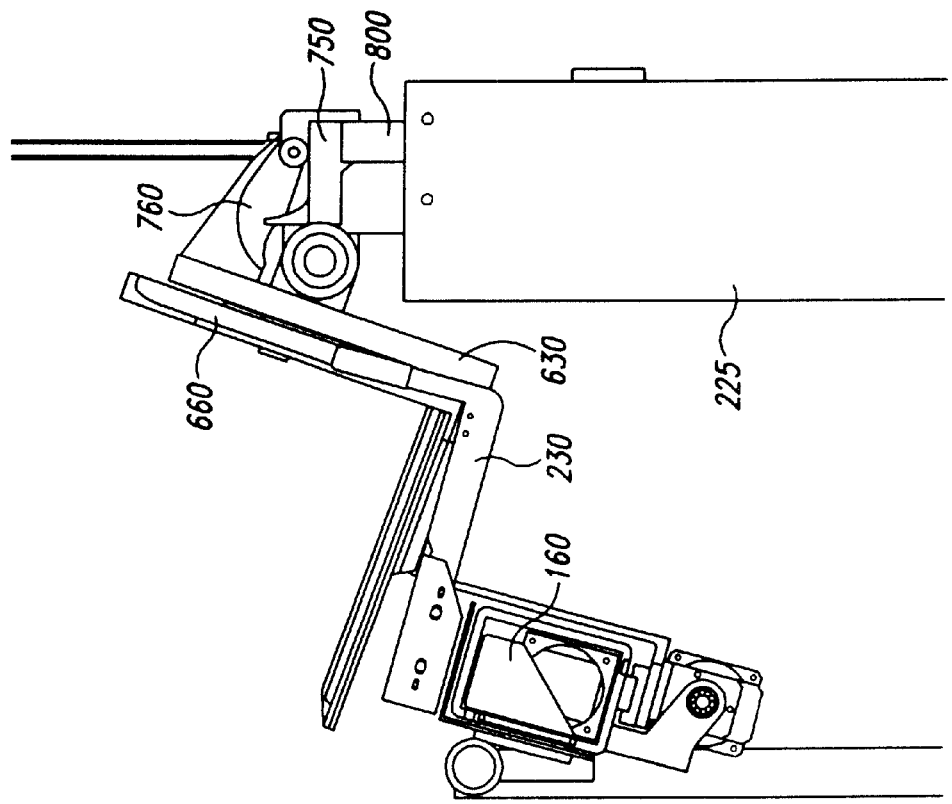
FIGS. 10–13 are partial side elevation views illustrating a sequence of views showing the transfer of a cassette carrier between one of the inventory cassette supports of the workpiece cassette inventory assembly and a staging cassette support of one of the lift/tilt assemblies.

As illustrated by FIG. 11, a pair of retainers 650 of the staging cassette support 630 of the lift/tilt assembly 225 move through a pair of retainers 270 of the inventory cassette support 230 of the workpiece cassette inventory assembly 160 as the staging cassette support 630 of the lift/tilt assembly 225 moves vertically upward. As the retainers 650 of the staging cassette support 630 of the lift/tilt assembly 225 move above the retainers 270 of the inventory cassette support 230 of the workpiece cassette inventory assembly 160, the cassette carrier is transferred from the inventory cassette support 230 of the workpiece cassette inventory assembly 160 to the staging cassette support 630 of the lift/tilt assembly 225.

Figure 13:
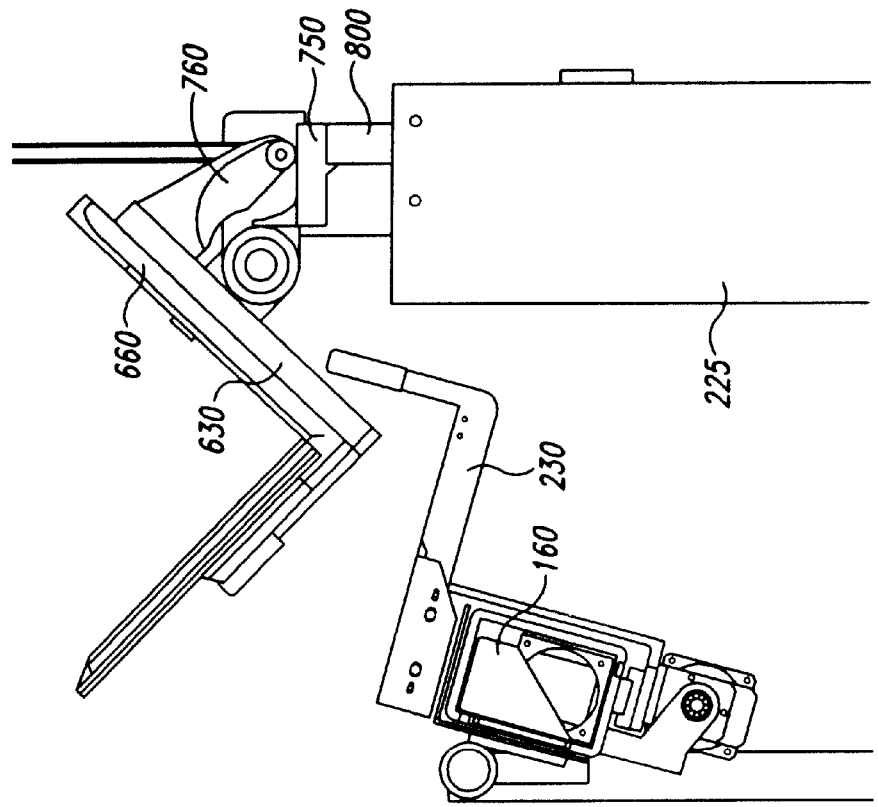
Figure 12:
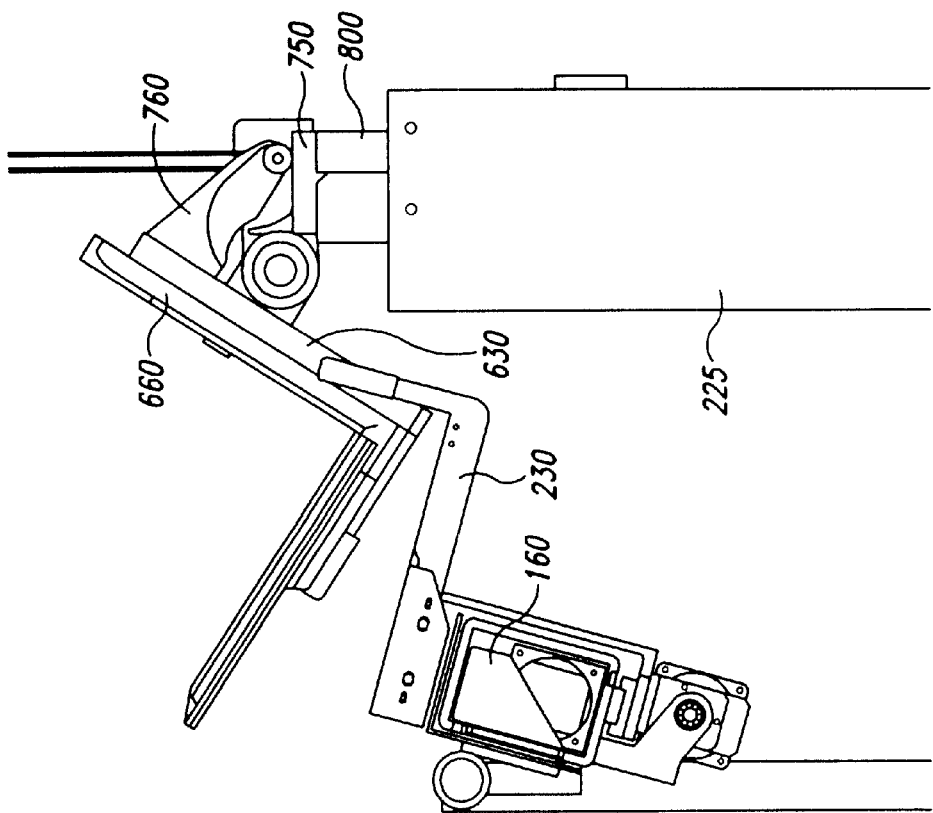

As illustrated in FIG. 12 and 13, as the staging cassette support 630 rises, a lever 760 moves along the surface of a ramp 750 and the staging cassette support 630 of the lift/tilt assembly 225 begins to rotate. Eventually, the staging cassette support rotates to a degree in which the staging cassette support 630 of the lift/tilt assembly 225 is in a substantially workpiece horizontal position. At this point, the microelectronic workpiece slots of the cassette, and any workpieces contained therein, will be available to the microelectronic workpiece transfer apparatus 50 for movement between the cassettes and the one or more processing stations 120.

In order to transfer the cassette carrier 660 back to the inventory cassette support 230 of the workpiece cassette inventory assembly 160 from the staging cassette support 630 of one of the lift/tilt assemblies 225, essentially the same process noted in FIGS. 10–13 can take place, only in reverse.

Although FIGS. 1 and 2 illustrate the use of workpiece cassette inventory assembly 160 and staging assembly 220 and a single input/output section 170, the teachings set forth herein can be extended to tools that use separate input/output sections or multiple input/output sections. For example, such a tool may be constructed to have an input section disposed at one end of a linear processing section and an output section disposed at the opposite end of the linear processing section. In tools having nonlinear processing sections, separate input and output sections can be arranged to optimize the overall tool layout.

Figure 3:
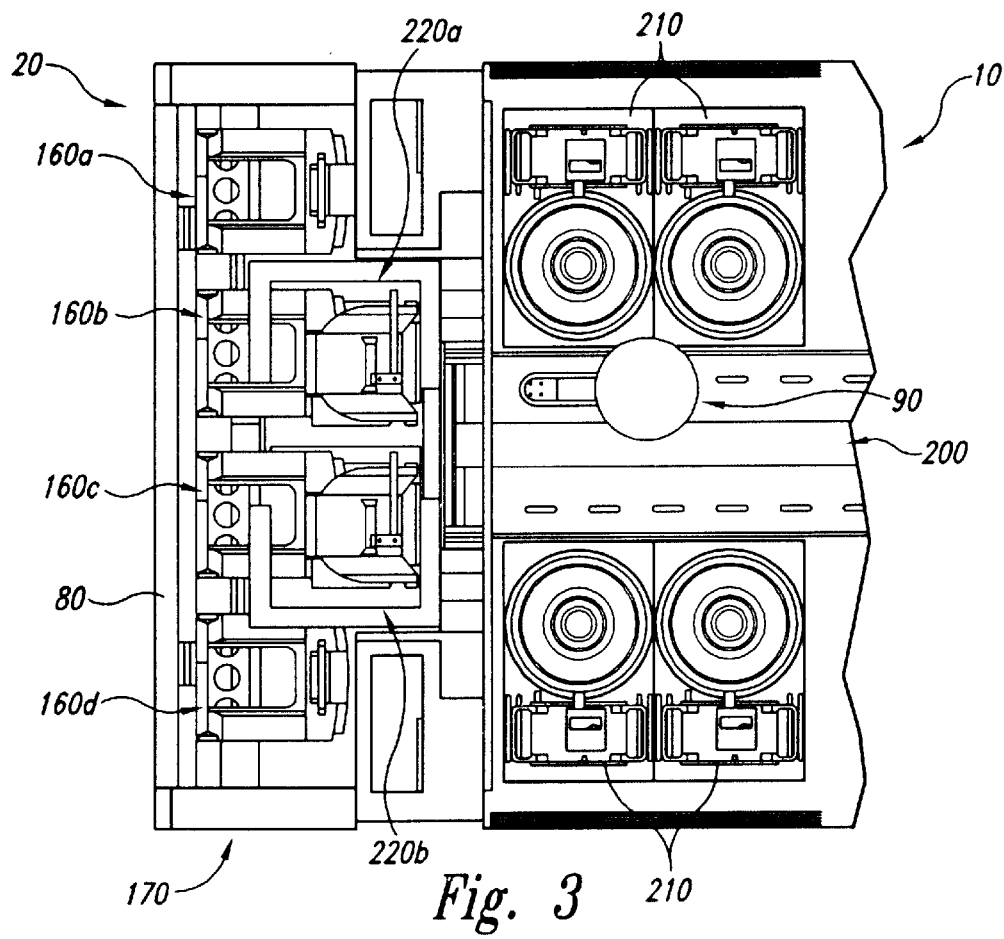
FIG. 3 is a more detailed partial plan view of the integrated microelectronic workpiece processing tool including a workpiece cassette inventory assembly illustrated in FIG. 2.
Figure 14:
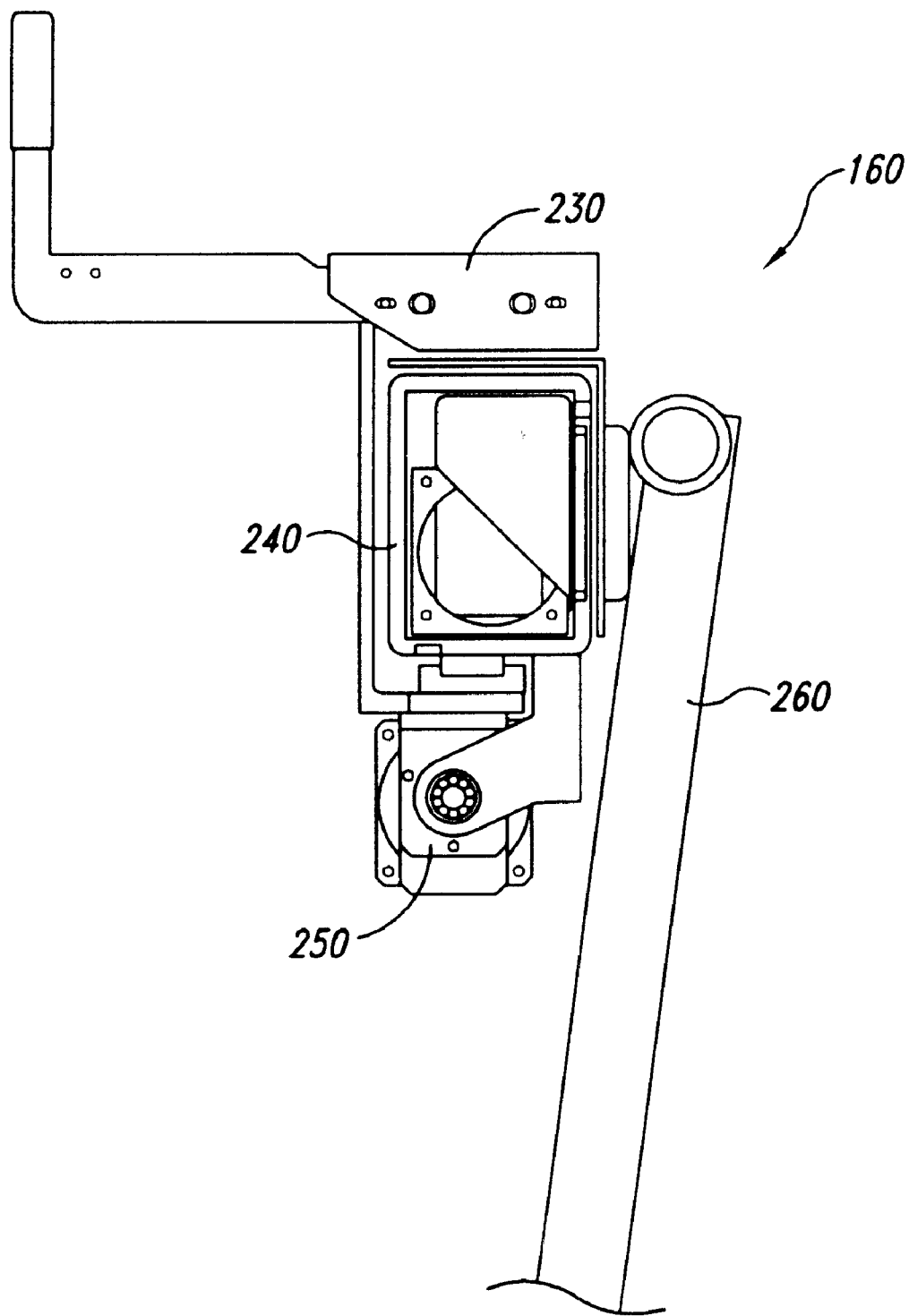
FIG. 14 is a side view of the workpiece cassette inventory assembly illustrated in FIG. 2.
Figure 15:
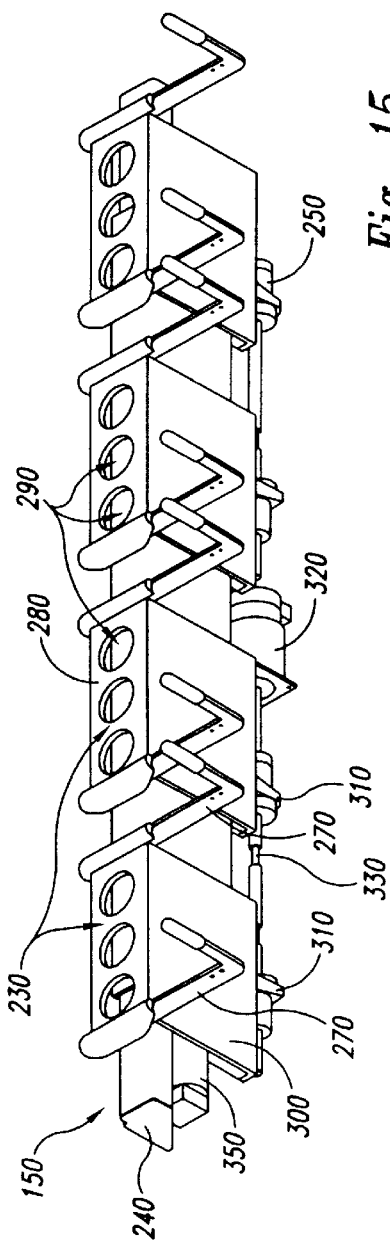
FIG. 15 is an isometric view of the workpiece cassette inventory assembly illustrated in FIG. 14 showing the inventory cassette supports of the workpiece cassette inventory assembly in spaced apart and shifted in an extended and centered position.
Figure 16:
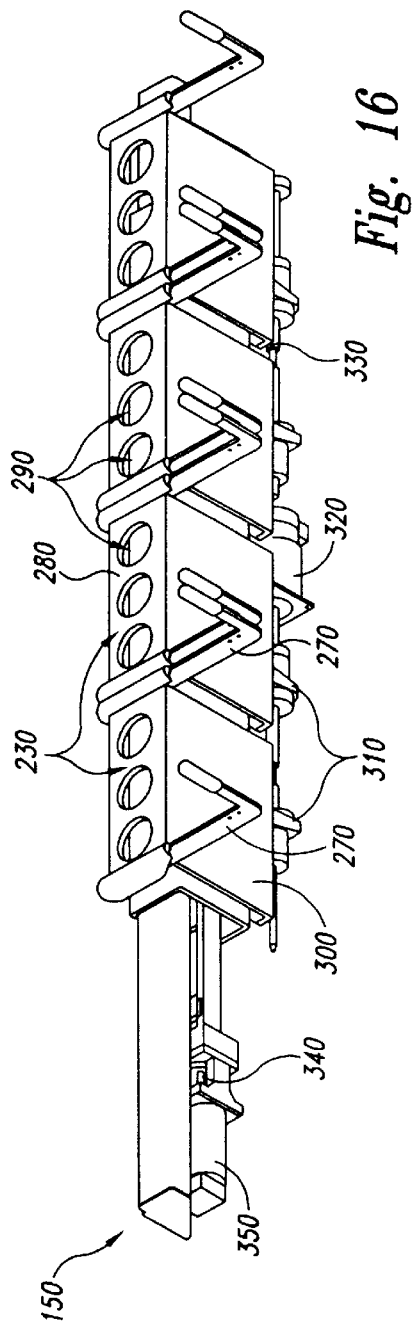
FIG. 16 is an isometric view of the workpiece cassette inventory assembly illustrated in FIG. 14 showing the inventory cassette supports of the workpiece cassette inventory assembly in a retracted position, wherein the inventory cassette supports are shifted to the right.

FIGS. 14–16 illustrate an exemplary workpiece cassette inventory assembly section 160 that may be used in the tool illustrated in FIGS. 1, 2, and 3. The embodiment of the workpiece cassette inventory assembly 160 shown in FIGS. 14–16 includes a plurality of cassette supports 230 (only one shown in FIG. 14) that are each adapted to hold a single cassette, a cassette support shift assembly 240, and a cassette spacing assembly 250. The workpiece cassette inventory assembly 160 is connected to an appropriate support 260, which may be in fixed alignment with the frame of the tool 150. FIG. 15 shows the supports 230 of the workpiece cassette inventory assembly 160 in an extended condition in which the supports are spaced apart from one another. The supports 230 may be spaced, for example, equidistant from one another when they are driven to this condition. FIG. 16 shows the supports 230 of the workpiece cassette inventory assembly 160 in a retracted condition in which the supports 230 are immediately adjacent one another. In the particular retracted condition, shown in FIG. 16, the supports 230 are shifted or shuttled to the right when compared to the extended condition shown in FIG. 15.

In the embodiment illustrated in FIGS. 15 and 16, the workpiece cassette inventory assembly 160 includes four cassette supports 230. Each support 230, in turn, is comprised of a pair of retainers 270, and a cross member 280 extending between and interconnecting retainers 270. Retainers 270 are designed to engage a cassette carrier. The cross member 280 may include several circular openings 290 or voids that assist in increasing air circulation proximate the support 230, and help to reduce the overall weight of the support 230. Cross member 280 mounts the retainer to a cassette translator assembly 250, and may have a portion 300 that connects the support 230 to the cassette translator assembly 250. The cassette translator assembly 250 is used to drive the supports 230 to predetermined positions in which the cassettes may be inserted into or remove from the tool. Additionally, the cassette translator assembly 250 is used to drive the supports 230 to further predetermined positions in which one or more of the cassettes may be transferred to or from one of the staging assemblies 220. For example, the cassette translator assembly 250 may be used to drive the cassettes laterally between one or more extended conditions, between one or more retracted conditions, and between a retracted condition and an extended condition.

In the illustrated embodiment of FIGS. 15–16, the support is coupled to a corresponding guide block 310 forming part of the cassette translator assembly 250. In addition to the guide blocks 310, the cassette translator assembly 250 includes a cassette translating motor 320 and a threaded transmission rod 330 or lead screw coupled to the motor 320. The guide blocks 310 are coupled to the threaded transmission rod 330, and travel along the threaded transmission rod 330 as the threaded transmission rod 330 turns. The characteristics of the threads of the threaded transmission rod 330 may be used to define the direction and the rate of travel of each of the guide blocks 310 and the corresponding supports 230 as the threaded transmission rod 330 is rotated by motor 320. More specifically, the direction of the threads may be used to define the direction of travel of each of the guide blocks 310 with respect to the threaded transmission rod 330 and the pitch of the threads may be used to define the rate of travel of each of the guide blocks 310.

Figure 17:
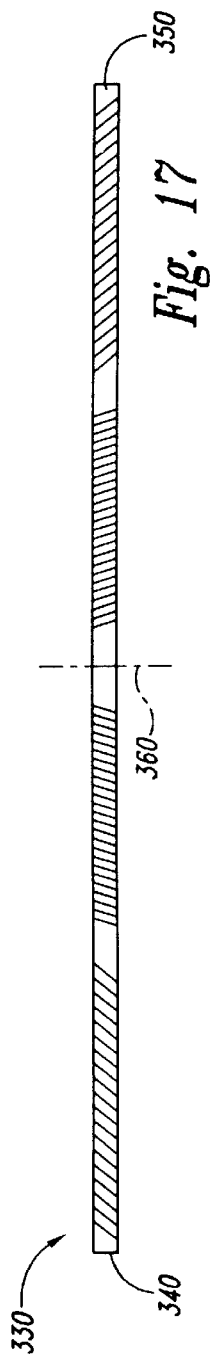
FIG. 17 is a threaded transmission rod of the workpiece cassette inventory assembly illustrated in FIG. 14 for affecting the horizontal spacing of the inventory cassette supports of the workpiece cassette inventory assembly.

FIG. 17 illustrates one embodiment of a threaded transmission rod 330 suitable for use in the cassette translator assembly 250. In the illustrated embodiment, opposite ends 340 and 350 of the threaded transmission rod 330 include oppositely directed threads (i.e. right handed and left handed threads). As a result, guide blocks 310 coupled to the threaded transmission rod 330 will either move concurrently toward the center 360 of the threaded transmission rod 330 or concurrently away from the center 360 of the threaded transmission rod 330, dependent upon the direction of rotation of the threaded transmission rod 330. Furthermore the pitch of the threads closer to the center 360 of the threaded transmission rod 330 may be less than the pitch of the threads that are farther from the center 360. This causes the outer guide blocks 310 and their respective supports 230 to travel along the axis of rod 330 at a rate that is greater than the rate of travel of the inner guide blocks 310 and their respective supports 230. This allows accurate control of the spacing between all of the guide blocks 310 using a single drive motor. Without limitation, the value of the pitch of the threads farther from the center 360 may be three times the value of the pitch of the threads closer to the center 360.

The position of the supports 230 in workpiece cassette inventory assembly 160 may also be subject to the control of a cassette shift assembly 240. Whereas the cassette translator assembly 250 adjusts the spacing between the supports 230, the cassette shift assembly 240 uniformly shifts all of the supports 230 as a single unit. In the illustrated embodiment, the supports may be shifted either to the left or the right. Concurrent shifting of the supports 230 may be accomplished by directly driving the cassette translator assembly 250 laterally. Alternatively, cassette translator assembly 250 may effectively be free-standing so that a linear drive mechanism may be connected to one or more of the supports 230. Without limitation, one or more of the supports 230 and/or the cassette translator assembly 250 may be connected to a linear actuator, such as a pneumatic piston, servo drive, etc. Similarly, one or more of the guide blocks 310 of the cassette translator assembly 250 may include an additional threaded aperture that is connected to a further corresponding transmission rod that is driven by a separate motor. By adjusting the lateral spacing and the overall lateral position of the supports 230, the supports 230 and the corresponding cassettes can be selectively aligned with operator doors through which the cassettes can be removed and loaded as well as selectively aligned with the supports of the workpiece staging assembly 220.

Figure 18:
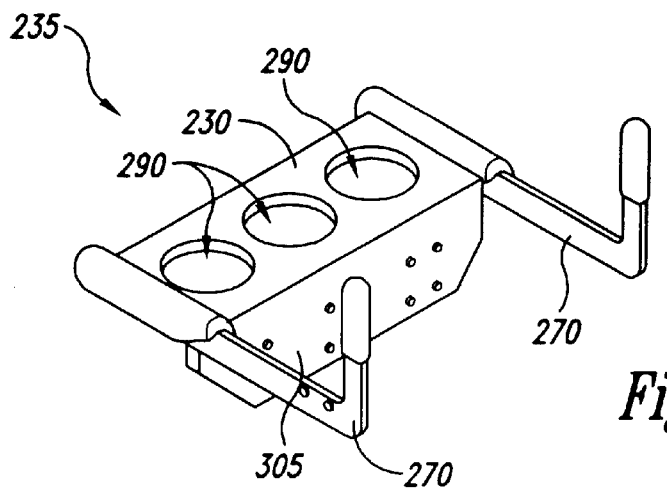
FIG. 18 is an isometric view of an alternative embodiment of an inventory cassette support for a workpiece cassette inventory assembly.

FIG. 18 illustrates an alternative embodiment of an inventory cassette support 235. Similar to the cassette supports 230 illustrated in FIGS. 15 and 16, the alternative cassette support provides for a pair of retainers 270 and a horizontal cross member 280. However, whereas the cassette supports 230 (FIGS. 15 and 16) has a portion 300 which extends vertically and underneath the cassette translator assembly 250 where it connects to the cassette translator assembly 250, cassette support 235 has a portion 305 which connects to the cassette translator assembly along its vertical portion.

Figure 19:
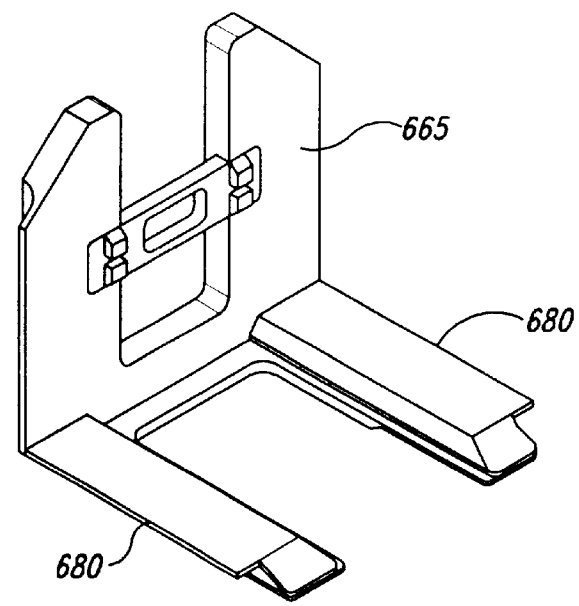
FIG. 19 is an isometric view of one embodiment of a cassette carrier.
Figure 22:
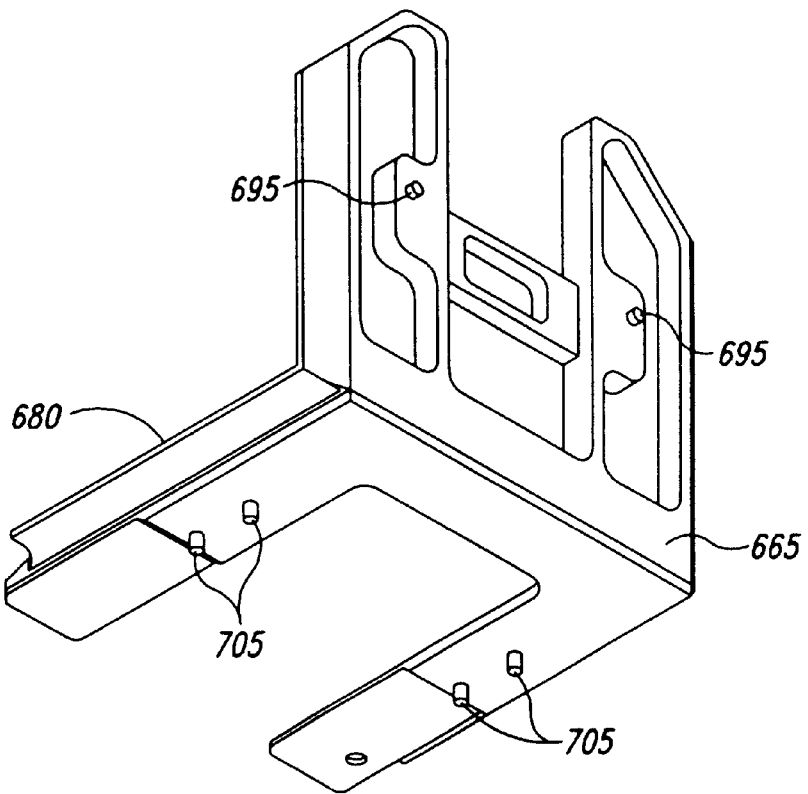
FIG. 22 is a bottom isometric view of the cassette carrier illustrated in FIG. 19 illustrating locating pins inserted in both the bottom and the back of the cassette carrier.
Figure 25:
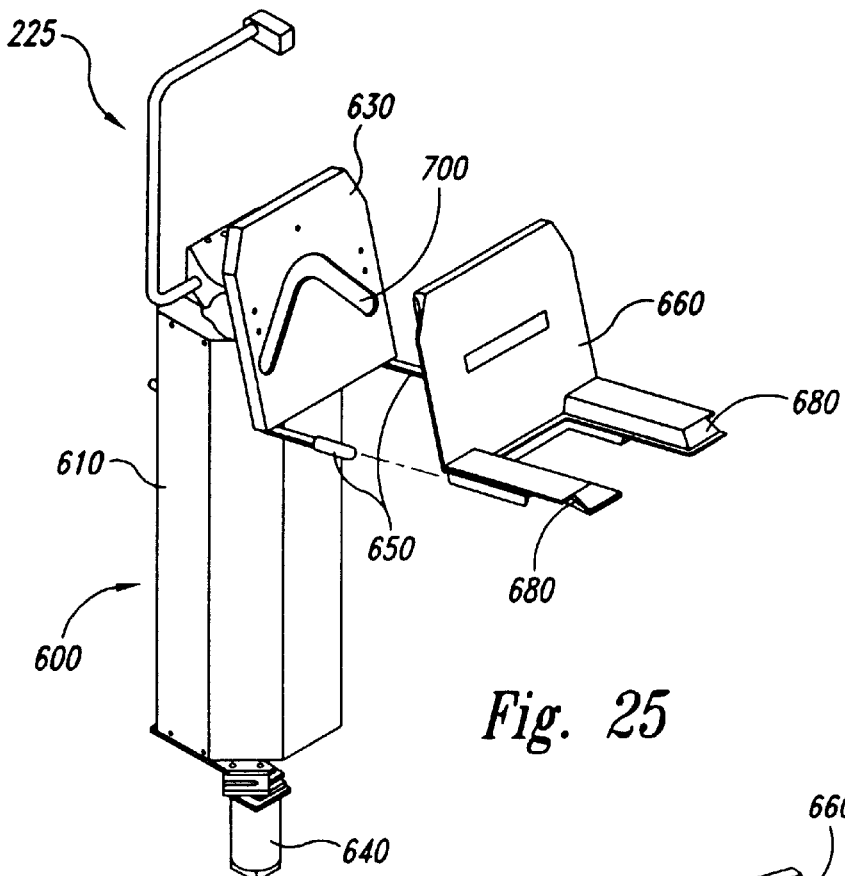
FIG. 25 is an isometric view of the lift/tilt assembly illustrated in FIG. 2.
Figure 26:
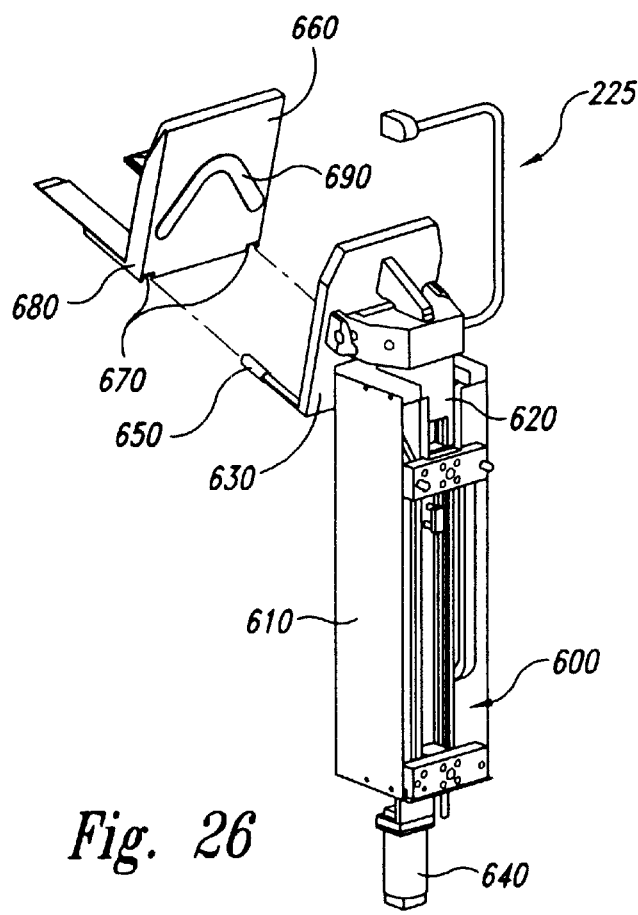
FIG. 26 is a back isometric view of the lift/tilt assembly illustrated in FIG. 25.

FIGS. 19 and 22 illustrate a cassette carrier 665 which is used to provide an adapted interface between various types of cassettes and both the inventory cassette support 230 and the staging cassette support 630. The cassette carrier 665 similarly allows a cassette to be engaged by two different sets of retainers, namely the retainers 270 of the inventory cassette support 230 and the retainers 650 of the staging cassettes support 630 (FIGS. 25 and 26).

Figure 20:
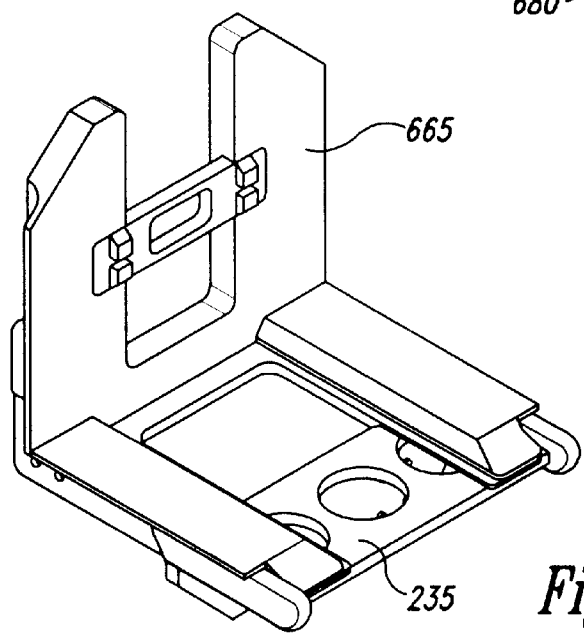
FIGS. 20 and 21 are front and back isometric view of the cassette carrier illustrated in FIG. 19 received by the inventory cassette support illustrated in FIG. 20.
Figure 21:
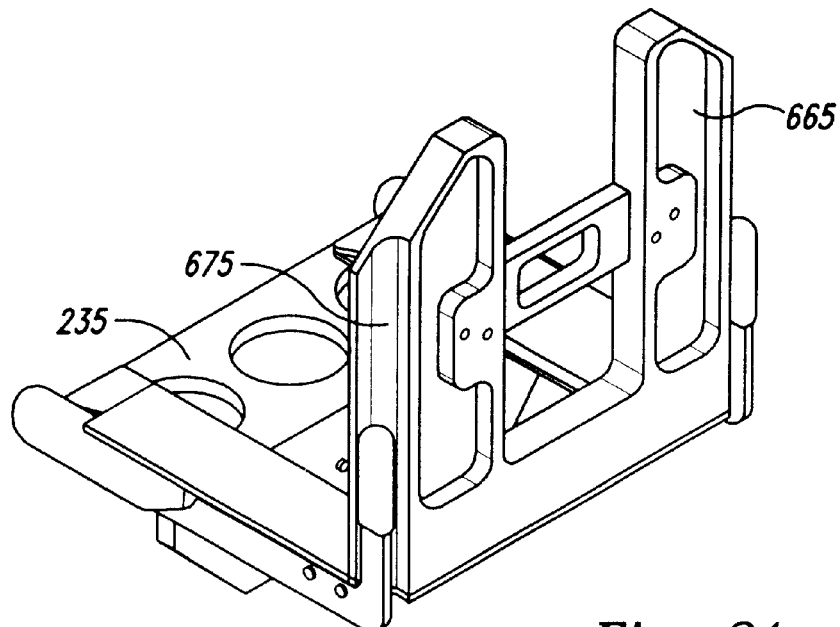

In the illustrated embodiment, the cassette carrier 665 includes ridges or wings 680, which extend along both sides of the cassette carrier 665. The ridges or wings extend along both the bottom and the back of the cassette carrier 665. It is along the ridges that the retainers 270 of the cassette support 230 engage the cassette carrier 665, as illustrated in both FIGS. 20 and 21.

As illustrated in FIG. 22, the cassette carrier 665 includes two pairs of pins 705 which define a pair of positions along which a second set of retainers can engage the cassette carrier 665. In the illustrated embodiment, the retainers 650 of the staging cassette support 630 (FIGS. 25 and 26) engages the cassette carrier by resting along the two pairs of pins 705. The cassette carrier further provides additional pins 695 which extend from the back of the cassette carrier and which can engage a corresponding indentation in the staging cassette support.

Figure 23:
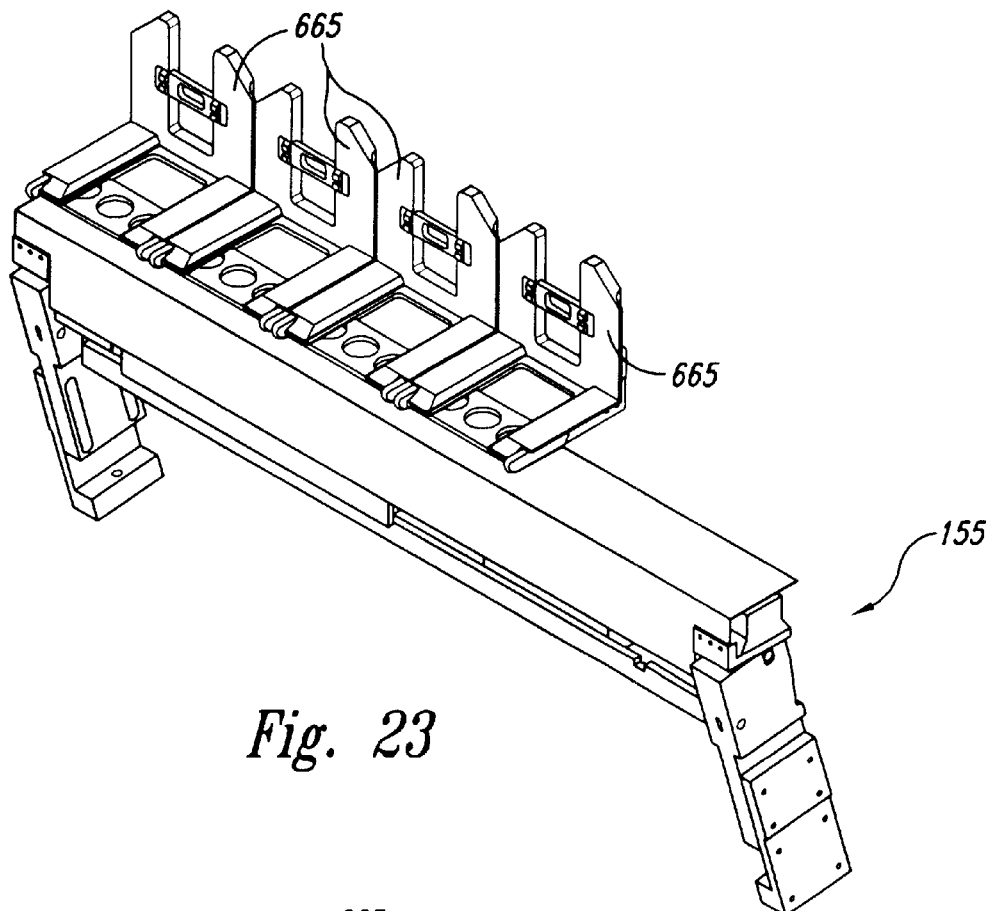
FIGS. 23 and 24 are isometric views of an alternative embodiment of the workpiece cassette inventory assembly further illustrating multiple cassette carriers illustrated in FIG. 19 received by the multiple inventory cassette supports of the workpiece cassette inventory assembly.
Figure 24:
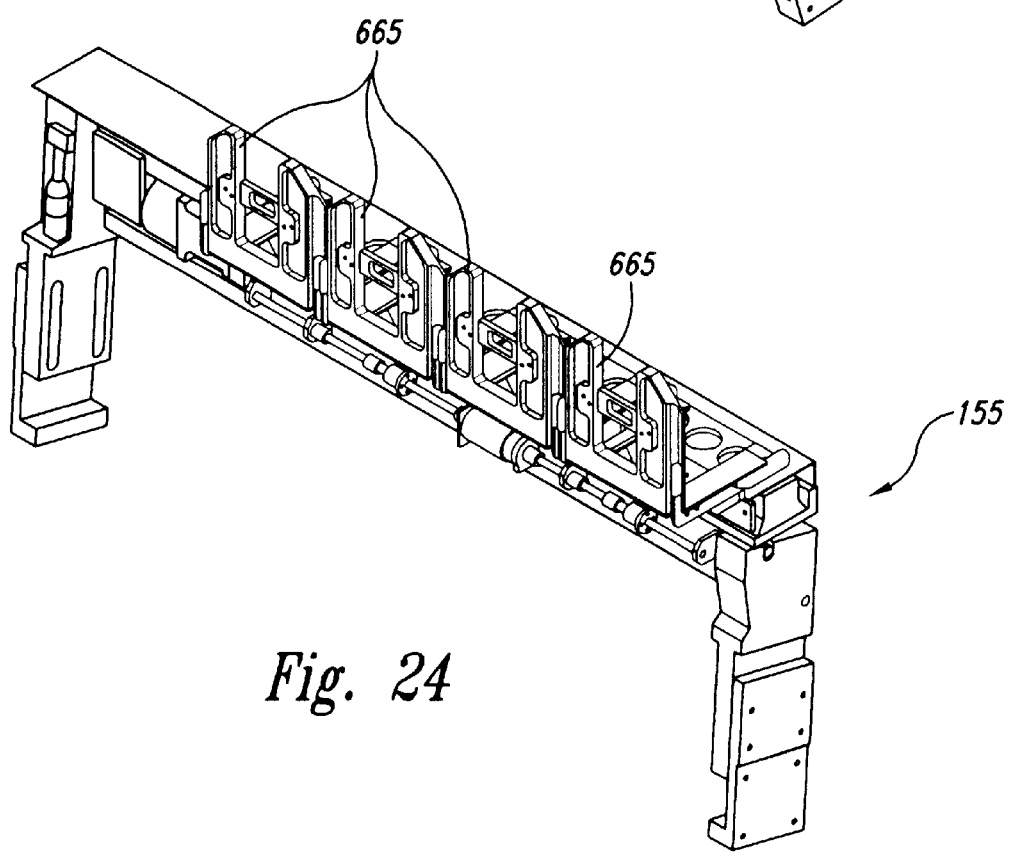

FIGS. 23 and 24 illustrate both a front and back isometric view of workpiece cassette inventory assembly 155 with a plurality of cassette carriers 665 received by the four interface cassette supports.

FIGS. 25 and 26 illustrate front and back isometric views of one embodiment of an assembly 220 that is suitable for use in the tool illustrated in FIG. 2. The specific embodiment of the assembly shown in FIGS. 25 and 26 is in the form of a lift/tilt assembly. The lift/tilt assembly 225 receives a cassette in a first orientation in which the workpieces within the cassette are substantially vertical. The lift/tilt assembly 225 then lifts and reorients the cassette to a second orientation in which the workpieces are substantially horizontal. In FIGS. 25 and 26, the lift/tilt assembly 225 is in the first orientation in which it is ready to receive a cassette.

The lift/tilt assembly 225 includes a linear guide/actuator 600 having a fixed frame 610 and a movable frame 620. The lift/tilt assembly further includes a staging cassette support 630 coupled to the movable frame 620, and a motor coupled to the linear guide/actuator 600 for moving the movable frame 620 and the staging cassette support 630 vertically with respect to the fixed frame 610. The staging cassette support 630 of the lift/tilt assembly 225, similar to the inventory cassette support 230 of the workpiece cassette inventory assembly 160, includes a pair of retainers 650.

In the illustrated embodiment and without limitation, the staging cassette support 630 of the lift/tilt assembly 225 receives the cassette via a cassette carrier 660 instead of receiving a cassette directly on the retainers 650. The cassette carrier 660, in turn, is adapted for holding the cassette. The use of a cassette carrier 660 enables the cassette carrier 660 to be adjusted to accommodate cassettes of different sizes and shapes. This allows a single cassette support construction to accommodate multiple cassette types. In the illustrated embodiment, the cassette carrier 660 accommodates two sets of retainers 270 and 650. A first set of retainers corresponds to the retainers 650 of the staging cassette support 630 of the lift/tilt assembly 225, which are adapted to engage a pair of indented slots 670 of the cassette carrier 660. This is alternative to pins 705 of cassette carriers 605 illustrated in FIG. 22. A second set of retainers corresponds to the retainers 270 of the inventory cassette support 230 of the workpiece cassette inventory assembly 160 (FIGS. 15 and 16), which are adapted to engage ridges or wings 680 extending outward from the sides of the cassette carrier 660. During a transfer of a cassette between the inventory cassette support 230 of the workpiece cassette inventory assembly 160 and the staging cassette support 630 of the lift/tilt assembly 225, the retainers 650 of the staging cassette support 630 of the lift/tilt assembly 225, being spaced apart more narrowly, pass between the retainers 270 of the inventory cassette support 230 of the workpiece cassette inventory assembly 160 to effectively allow a hand-off of the cassette between the two.

Cassette carrier 660 also includes an angled protrusion 690 (FIG. 26) that engages a corresponding angled indentation 700 (FIG. 25) in the surface of the staging cassette support 630 of the lift/tilt assembly 225. Once engaged, the protrusion 690 and the corresponding indentation 700 help to limit unwanted movement of the cassette carrier 660 with respect to the staging cassette support 630 of the lift/tilt assembly 225. Where the alternative cassette carrier 665 illustrated in FIG. 19 is used, the staging cassette support 630 has a pair of indentations to alternatively correspond to the pair of pins 695 (FIG. 22), so as to limit unwanted movement.

Figure 27:
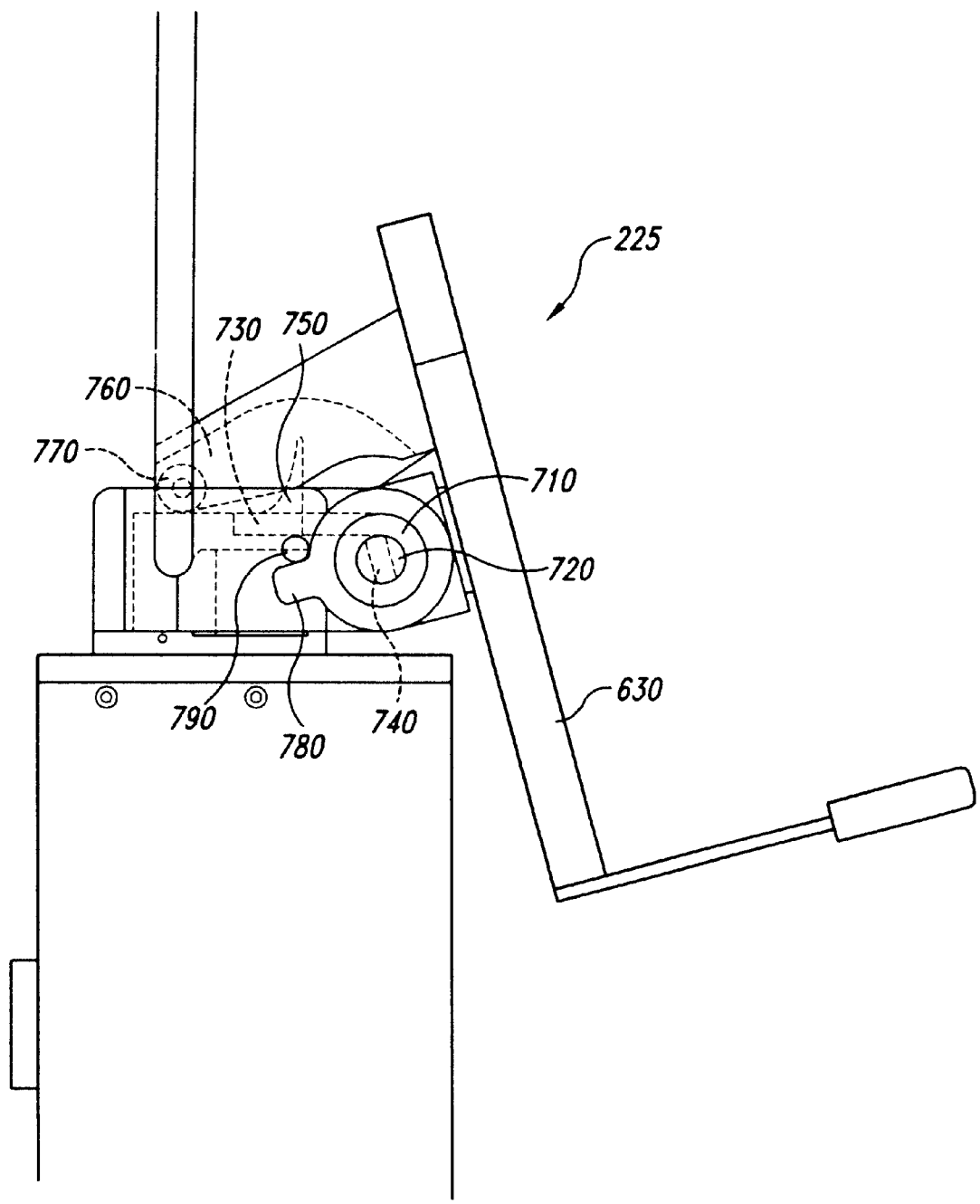
FIG. 27 is a partial side view of the lift/tilt assembly shown in FIG. 25, including hidden lines illustrating the spatial relationship of some of the inner mechanisms.

FIG. 27 is a partial side view of the lift/tilt assembly 225 shown in FIG. 25, including hidden lines illustrating the spatial relationship of some of the inner mechanisms of the lift/tilt assembly 225. In contrast to other lift/tilt assemblies, staging cassette support 630 of the lift/tilt assembly 225 is maintained at substantially the same orientation as the inventory cassette support 230 of the workpiece cassette inventory assembly 160 as the staging cassette support 630 is initially moved upward vertically. Such operation facilitates a smooth transfer of the cassette between the workpiece cassette inventory assembly 160 and the corresponding lift/tilt assembly 225.

Figure 28:
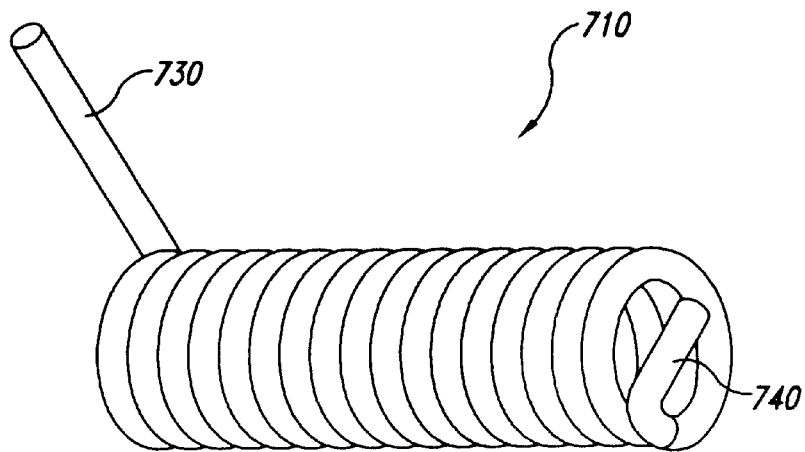
FIG. 28 is an isometric view of a spring used to bias the staging cassette support of the lift/tilt assembly toward a substantially workpiece horizontal tilt position.

The lift/tilt assembly 225 may also include a cassette support rotational bias spring 710, which is coiled around the pivot point 720 of the staging cassette support 630. An isometric view of the cassette support rotational bias spring 710 is illustrated in FIG. 28. One end 730 of the cassette support rotational bias spring 710 is fixed with respect to the staging cassette support 630 so that it cannot rotate. The other end 740 of the cassette support rotational bias spring 710 is connected to rotate with the staging cassette support 630. The spring is tensioned so as to bias the staging cassette support 630 of the lift/tilt assembly 225 to an orientation in which the workpieces within the cassette are substantially horizontal.

The lift/tilt assembly 225 further includes a ramp 750, and the staging cassette support 630 of the lift/tilt assembly 225 further includes a lever 760 for engaging the ramp 750. More specifically, the lever 760 includes a ball bearing 770 at the end of the lever 760, which engages the ramp 750. While the lever 760 engages the ramp 750, the staging cassette support 630 is biased toward a substantially workpiece vertical position. As the staging cassette support 630 travels lower the force created by the lever engaging the ramp 750 generally increases overcoming the force exerted upon the staging cassette support 630 by the cassette support rotational bias spring 710, such that during the lower portion of the vertical travel of the staging cassette support 630, the rotational orientation of the staging cassette support 630 is largely influenced by the lever 760 and the ramp 750. At a certain point, a stop 780 on the pivot point 720 engages a pin 790 preventing the further rotation of the staging cassette support 630. At the point of engagement, all force is then applied to the ramp springs to ensure compression.

Figure 29:
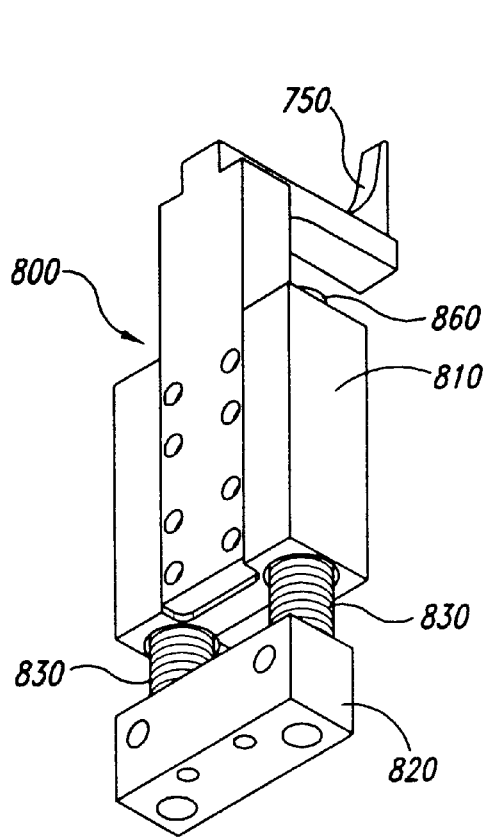
FIG. 29 is an isometric view of a ramp and a corresponding ramp spring assembly, partially illustrated in FIG. 28.
Figure 30:
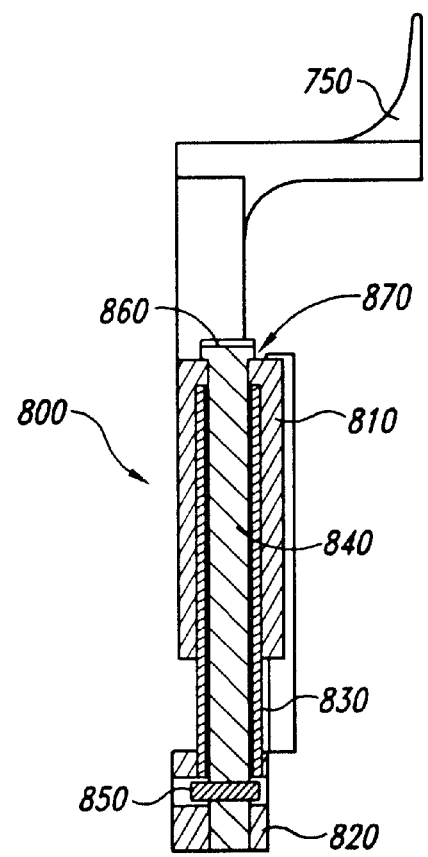
FIG. 30 is a side sectional view of the ramp and corresponding ramp spring assembly, illustrated in FIG. 29.

FIGS. 29 and 30 illustrate a ramp spring assembly 800 that may be used to facilitate the vertical motion of the staging cassette support 630. When the staging cassette support 630 of the lift/tilt assembly 225 is oriented with the inventory cassette support 230 of the workpiece cassette inventory assembly 160, the ramp 750 is supported by the ramp spring assembly 800. As shown, the ramp spring assembly 800 includes a ramp spring 830, which may be compressed. This enables the ramp 750 to travel vertically downward with the staging cassette support 630 after the lever 760 engages the ramp 750 and the staging cassette support 630 has rotated to orient the workpieces vertically, so as to allow the staging cassette support 630 to maintain a workpiece vertical orientation during the hand-off portion of its vertical movement, as illustrated in FIGS. 10 and 11.

The ramp spring assembly 800 also includes an upper body block 810 and a lower body block 820. The upper body block 810 is mounted to the lower body block 820 via a pair of the ramp springs 830 and a pair of spring guides 840. The ramp springs 830 are each located around a corresponding one of the pair of spring guides 840. The spring guides 840 are fixed with respect to the lower body block 820 via a pair of safety lock pins 850, while the spring guides 840 are received within the upper body block 810 inside a pair of cylindrically shaped cavities. The upper body block 810 can travel vertically along the spring guide 840. While the upper body block 810 travels vertically along the spring guides 840, the upper body block 810 is biased away from the lower body block 820 by the ramp springs 830. A head 860 on the spring guide having a diameter that is larger than the opening of the cylindrically shaped cavity prevents the upper body block 810 from traveling vertically along the spring guides 840 away from the lower body block 820 beyond a fixed point 870.

The force of each of the compression ramp springs 830 is selected so as to exert a force that limits the compression of the ramp springs 830. More particularly, the compression is limited so that a majority of the compression takes place after the rotational orientation of the staging cassette support 630 has been biased toward a substantially workpiece vertical orientation. In this way, the lift/tilt assembly 225 provides for a vertical motion of the staging cassette support 630 through the cassette transfer point between the lift/tilt assembly 225 and the workpiece cassette inventory assembly 160, while the staging cassette support 630 of the lift/tilt assembly 225 has a similar rotational orientation as the inventory cassette support 230 of the workpiece cassette inventory assembly 160.

Once processing of the first set of workpieces from the first set of cassettes is complete, the first set of cassettes can be returned to the inventory cassette supports of the workpiece cassette inventory assembly 160 and a second set of cassettes can be received from the workpiece cassette inventory assembly 160, thereby enabling processing to continue without intermediate operator activity. The frequency of operator activity is reduced and workpiece processing efficiencies are enhanced.

Given the teachings of the present invention, it will be recognized that the multi-cassette assembly may be readily adapted to various existing tools that include a workpiece staging assembly with a fixed number of cassette supports. As such, the present inventors have taught that it is readily possible to retrofit such existing tools with a multi-cassette assembly to enhance the processing efficiencies.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. An apparatus for receiving a plurality of cassettes each having one or more slots for holding a microelectronic workpiece and for providing access to the slots and the microelectronic workpieces within the plurality of cassettes, the apparatus comprising:

a workpiece cassette inventory assembly including a plurality of inventory cassette supports for receiving a plurality of cassettes and a drive mechanism coupled to the inventory cassette supports, the drive mechanism being configured to (a) adjust spacing between the inventory cassette supports by laterally moving at least two individual inventory cassette supports different distances and to (b) shift the inventory cassette supports by laterally moving the inventory cassette supports in tandem, wherein the drive mechanism selectively positions individual inventory cassette supports at a staging location; and a workpiece cassette staging assembly including at least one staging cassette support at the staging location, the staging cassette support being configured to move between (a) the staging location for receiving/delivering an individual cassette from/to an inventory cassette support positioned at the staging location and (b) a transfer location for providing access to microelectronic workpieces contained within the individual cassette.

2. An apparatus in accordance with claim 1 wherein the workpiece cassette inventory assembly further includes a cassette shift assembly comprising a cassette shift motor, a threaded transmission rod coupled to the cassette shift motor, and one or more cassette shift guide blocks coupled to the threaded transmission rod and the inventory cassette supports for adjusting the horizontal shift of the plurality of cassettes.

3. An apparatus in accordance with claim 1 wherein the workpiece cassette staging assembly includes one or more lift/tilt assemblies incorporating the one or more staging cassette supports for adjusting the elevation and the rotational orientation of the received indexed cassettes.

4. An apparatus in accordance with claim 3 wherein the workpiece cassette staging assembly includes a pair of lift/tilt assemblies, each incorporating one of the staging cassette supports, and the workpiece cassette inventory assembly includes four inventory cassette supports.

5. An apparatus in accordance with claim 4 wherein the workpiece cassette inventory assembly selectively indexes a first and a second of the four inventory cassette supports to a first one of the pair of lift/tilt assemblies, and the workpiece cassette inventory assembly selectively indexes a third and a fourth of the four inventory cassette supports to a second one of the pair of lift/tilt assemblies.

6. An apparatus in accordance with claim 3 wherein each lift/tilt assembly comprises a linear guide/actuator including a fixed frame and a movable frame; a staging cassette support rotatably coupled to the movable frame; and a staging motor coupled to the linear guide/actuator for vertically moving the movable frame and the staging cassette support with respect to the fixed frame.

7. An apparatus in accordance with claim 6 wherein each lift/tilt assembly further comprises a staging cassette support rotational bias spring which biases the staging cassette support of the lift/tilt assembly to rotationally orient a cassette and the microelectronic workpieces located therein toward a substantially workpiece horizontal position.

8. An apparatus in accordance with claim 6 wherein each lift/tilt assembly further comprises a ramp including an upper travel surface and a lower travel surface, and the staging cassette support of the lift/tilt assembly includes a lever for engaging the ramp along the upper and lower travel surface of the ramp during the vertical travel of the staging cassette support, wherein while the lever engages the lower travel surface of the ramp, the staging cassette support is biased toward a substantially workpiece vertical position.

9. An apparatus in accordance with claim 8 wherein each lift/tilt assembly further comprises a ramp spring assembly coupled to the ramp for facilitating a limited vertical movement of the ramp with the corresponding vertical movement of the staging cassette support while the lever of the staging cassette support engages the lower travel surfaces of the ramp, and the workpieces are oriented in a substantially workpiece vertical orientation.

10. An apparatus in accordance with claim 9 wherein the apparatus transfers the cassette between the staging cassette support of the lift/tilt assembly and the inventory cassette support of the workpiece cassette inventory assembly during the limited vertical movement of the ramp while the staging cassette support of the lift/tilt assembly moves vertically.

11. An apparatus in accordance with claim 1 wherein each of the plurality of cassettes is received by the inventory cassette support via a cassette carrier adapted for receiving the cassette.

12. An apparatus in accordance with claim 11 wherein the inventory cassette supports and the staging cassette supports, each includes at least a pair of retainers.

13. An apparatus in accordance with claim 12 wherein the cassette carrier includes a pair of wings extending from the sides of the cassette carrier, and wherein the pair of retainers of the inventory cassette support are spaced apart so as to engage the cassette carrier via the pair of wings.

14. An apparatus in accordance with claim 12 wherein the cassette carrier includes a pair of grooves formed into the bottom of the cassette carrier proximate the sides of the cassette carrier, and wherein the pair of retainers of the staging cassette support are spaced apart so as to each engage the cassette carrier within one of the pair of grooves.

15. An apparatus in accordance with claim 12 wherein the cassette carrier includes two sets of pins extending down from the bottom of the cassette carrier proximate the sides of the cassette carrier and wherein the pair of retainers of the staging cassette support are spaced apart so as to each engage the cassette carrier against one of the sets of pins.

16. An apparatus in accordance with claim 12 wherein the pair of retainers of the inventory cassette support are spaced apart a distance different than the distance the pair of retainers of the staging cassette support are spaced apart so as to enable the retainers of the inventory cassette support to pass through the retainers of the staging cassette support without interference, when the inventory cassette support is positionally aligned with the staging cassette support and during the vertical movement of the staging cassette support.

17. An apparatus in accordance with claim 16 wherein the cassette carrier transfers between the inventory cassette support and the staging cassette support when the retainers of the inventory cassette support pass through the retainers of the staging cassette support.

18. An apparatus for receiving a plurality of cassettes each having one or more slots for holding a microelectronic workpiece and for providing access to the slots and the microelectronic workpieces within the plurality of cassettes, the apparatus comprising:

a workpiece cassette inventory assembly including a plurality of inventory cassette supports for receiving a plurality of cassettes and selectively indexing one or more of the plurality of cassettes by adjusting the positional alignment of the plurality of cassettes, wherein the workpiece cassette inventory assembly includes a cassette translator assembly comprising a cassette translator motor, a first threaded transmission rod coupled to the cassette translator motor, and a plurality of cassette translator guide blocks coupled to the first threaded transmission rod and each of the inventory cassette supports for adjusting the horizontal spacing of each of the plurality of cassettes with respect to the other cassettes as the threaded rod is rotated by the cassette translator motor; and a workpiece cassette staging assembly including one or more staging cassette supports for receiving the one or more indexed cassettes from the workpiece cassette inventory assembly and repositioning the one or more indexed cassettes, thereby providing access to the one or more microelectronic workpieces contained within the indexed cassettes, wherein one or more of the indexed cassettes are positionally aligned with one of the staging cassette supports.

19. An apparatus in accordance with claim 18 wherein the workpiece cassette inventory assembly further includes a cassette shift assembly comprising a cassette shift motor, a second threaded transmission rod coupled to the cassette shift motor, and a cassette shift guide block coupled to the second threaded transmission rod and the cassette translator assembly for adjusting the horizontal shift of the cassette translator assembly and the plurality of cassettes.

20. An apparatus for processing microelectronic workpieces comprising:

an input/output section for receiving a plurality of cassettes each adapted for holding one or more microelectronic workpieces, the input/output section including a workpiece cassette inventory assembly including a plurality of inventory cassette supports for receiving a plurality of cassettes and a drive mechanism coupled to the inventory cassette supports, the drive mechanism being configured to (a) adjust spacing between the inventory cassette supports by laterally moving at least two individual inventory cassette supports different distances and to (b) shift the inventory cassette supports by laterally moving the inventory cassette supports in tandem, wherein the drive mechanism selectively positions individual inventory cassette supports at a staging location, and a workpiece cassette staging assembly including at least one staging cassette support at the staging location, the staging cassette support being configured to move between (a) the staging location for receiving/delivering an individual cassette from/to an inventory cassette support positioned at the staging location and (b) a transfer location for providing access to microelectronic workpieces contained within the individual cassette;

a processing section having one or more processing stations for processing the microelectronic workpieces; and a microelectronic workpiece transfer apparatus for accessing individual microelectronic workpieces within the cassette and transferring the individual microelectronic workpiece between the cassette and one or more of the processing stations.

21. An apparatus in accordance with claim 20 wherein the one or more processing stations of the processing section each individually process the microelectronic workpieces.

22. A tool for processing microelectronic workpieces, comprising:

a processing section having a load/unload location;

a plurality of processing stations in the processing section;

a transfer apparatus in the processing section for moving microelectronic workpieces between the load/unload location and the processing stations; and a cassette handling apparatus adjacent to the load/unload location, the cassette handling apparatus including an inventory assembly having a plurality of inventory cassette supports and a first drive mechanism coupled to the inventory cassette supports, the first drive mechanism being configured to move the inventory cassette supports laterally between an inventory location and a staging location; and a staging assembly having a staging cassette support and a second drive mechanism assembly coupled to the staging cassette support, the staging cassette support being moveable between (a) a staging position in which the staging cassette support is aligned with the load/unload location of the processing section and immediately adjacent to an inventory cassette support positioned at the staging location to directly engage an individual cassette held by the inventory cassette support at the staging location, and (b) the load/unload location in which the transfer apparatus can access workpieces in the individual cassette.

* * * * *

UNITED STATES PATENT AND TRADEMARK OFFICE
CERTIFICATE OF CORRECTION

PATENT NO. : 6,471,460 B1
DATED : October 29, 2002
INVENTOR(S) : John M. Pedersen and Kyle M. Hanson It is certified that error appears in the above-identified patent and that said Letters Patent is hereby corrected as shown below:

Column 1,
Line 41, insert -- ® -- after "LT-210C";
Line 42, insert -- ® -- after "Millennium";

Column 5,
Line 54, "ergonornically" should be -- ergonomically --;

Column 6,
Line 22, insert space after "160$d$";

Column 16,
Line 32, delete "assembly".

Signed and Sealed this

Twenty-fifth Day of March, 2003

JAMES E. ROGAN
*Director of the United States Patent and Trademark Office*